(12) United States Patent
Takano et al.

(10) Patent No.: US 12,733,274 B2
(45) Date of Patent: Sep. 8, 2026

(54) IMAGING ELEMENT AND IMAGING DEVICE HAVING A POLYGONAL TRANSFER GATE OPENING

(71) Applicant: SONY SEMICONDUCTOR SOLUTIONS CORPORATION, Kanagawa (JP)

(72) Inventors: Tatsuya Takano, Oita (JP); Kentaro Eda, Oita (JP); Shintaro Okujo, Oita (JP); Kuniaki Utsumi, Oita (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 779 days.

(21) Appl. No.: 17/910,599

(22) PCT Filed: Feb. 2, 2021

(86) PCT No.: PCT/JP2021/003680
§ 371 (c)(1),
(2) Date: Sep. 9, 2022

(87) PCT Pub. No.: WO2021/186921
PCT Pub. Date: Sep. 23, 2021

(65) Prior Publication Data

US 2023/0154948 A1 May 18, 2023

(30) Foreign Application Priority Data

Mar. 18, 2020 (JP) ................................ 2020-047920

(51) Int. Cl.
*H10F 39/00* (2025.01)
*H10F 39/18* (2025.01)

(52) U.S. Cl.
CPC ..... *H10F 39/80377* (2025.01); *H10F 39/014* (2025.01); *H10F 39/182* (2025.01);
(Continued)

(58) Field of Classification Search
CPC ......... H10F 39/80377; H10F 39/80373; H10F 39/182; H10F 39/8027; H10F 39/8033; H10F 39/812
See application file for complete search history.

(56) References Cited

U.S. PATENT DOCUMENTS 9,735,197 B1 * 8/2017 Kwag .................. H10F 39/151
2009/0303371 A1 * 12/2009 Watanabe ............ H10F 39/802
257/292
(Continued)

FOREIGN PATENT DOCUMENTS

CN 102629614 A 8/2012
JP 2001168315 A 6/2001
(Continued)

OTHER PUBLICATIONS

International Search Report and Written Opinion prepared by the Japan Patent Office on Apr. 15, 2021, for International Application No. PCT/JP2021/003680, 2 pgs.

*Primary Examiner* — Aaron J Gray
(74) *Attorney, Agent, or Firm* — SHERIDAN ROSS P.C.

(57) ABSTRACT

A charge transfer path of a transfer transistor constituted by a vertical transistor is reduced. An imaging element includes a photoelectric conversion unit, a charge holding unit, a charge transfer unit, and an image signal generation unit. The photoelectric conversion unit is disposed on a semiconductor substrate and generates charge corresponding to incident light by photoelectric conversion. The charge holding unit holds the charge. The charge transfer unit includes an opening portion, which is formed in the semiconductor substrate and having a polygonal shape in a plan view, and an embedded gate disposed in the opening portion and transfers the charge from the photoelectric conversion unit
(Continued)

to the charge holding unit. The image signal generation unit generates an image signal based on the held charge.

18 Claims, 17 Drawing Sheets

(52) U.S. Cl.
CPC ..... *H10F 39/8027* (2025.01); *H10F 39/8033* (2025.01); *H10F 39/80373* (2025.01); *H10F 39/812* (2025.01)

(56) References Cited

U.S. PATENT DOCUMENTS

| | | | | |
|---|---|---|---|---|
| 2010/0314672 | A1* | 12/2010 | Manda | H10F 39/182 257/292 |
| 2012/0242875 | A1* | 9/2012 | Nakamura | H10F 39/80373 438/57 |
| 2014/0106495 | A1* | 4/2014 | Nakamura | H10F 39/199 438/57 |
| 2017/0294468 | A1* | 10/2017 | Park | H10F 39/812 |

FOREIGN PATENT DOCUMENTS

| | | |
|---|---|---|
| JP | 2010-287743 | 12/2010 |
| JP | 2012-199489 | 10/2012 |
| JP | 2019-165136 | 9/2019 |

* cited by examiner

IMAGING ELEMENT AND IMAGING DEVICE HAVING A POLYGONAL TRANSFER GATE OPENING

CROSS REFERENCE TO RELATED APPLICATIONS

This application is a national stage application under 35 U.S.C. 371 and claims the benefit of PCT Application No. PCT/JP2021/003680, having an international filing date of 2 Feb. 2021, which designated the United States, which PCT application claimed the benefit of Japanese Patent Application No. 2020-047920, filed 18 Mar. 2020, the entire disclosures of each of which are incorporated herein by reference.

TECHNICAL FIELD

The present disclosure relates to an imaging element and an imaging device. Specifically, the present disclosure relates to an imaging element and an imaging device using the imaging element, the imaging element being configured such that pixels each having a vertical transistor are disposed, and the vertical transistor transferring charge generated by photoelectric conversion in a photoelectric conversion unit disposed on a semiconductor substrate in a thickness direction of the semiconductor substrate.

BACKGROUND ART

In the related art, in an imaging element that images a subject, an imaging element in which pixels generating an image signal based on incident light are disposed in a two-dimensional lattice shape is used. In each of the pixels, a photodiode that generates charge corresponding to incident light by photoelectric conversion and a floating diffusion to which the generated charge is transferred are disposed. An image signal is generated based on the charge transferred to the floating diffusion. Further, in the pixel, a transfer transistor that transfers charge generated by the photodiode to the floating diffusion is further disposed. An imaging element in which a vertical transistor is used as the transfer transistor has been proposed (see, for example, PTL 1). The vertical transistor is a transistor configured with an embedded gate electrode and gate insulating film in the semiconductor substrate.

The vertical transistor is configured with the gate insulating film and the gate electrode disposed in a hole formed in the semiconductor substrate by dry etching. The gate insulating film is constituted by a silicon oxide ($SiO_2$) film formed on a bottom surface and a side surface of the hole by radical oxidation or plasma oxidation. The gate electrode is constituted by polycrystalline silicon and disposed adjacent to the gate insulating film of the hole. A channel of the vertical transistor is formed along the outer circumference of the embedded gate insulating film.

CITATION LIST

Patent Literature

[PTL 1]
JP 2010-287743 A

SUMMARY

Technical Problem

The related art described above has a problem that a charge transfer path of the transfer transistor becomes long.

As described above, a vertical transistor is configured in a form in which a gate insulating film and a gate electrode are embedded in a hole formed in a semiconductor substrate, and thus fine machining of a gate region is difficult, and a distance between a photodiode and a floating diffusion becomes long. For this reason, a charge transfer path becomes longer, and transfer efficiency deteriorates.

The present disclosure is contrived in view of the above-described problem, and an object thereof is to reduce a charge transfer path of a transfer transistor constituted by a vertical transistor.

Solution to Problem

The present disclosure is contrived in order to solve the above-described problem, and a first aspect thereof is an imaging element including a photoelectric conversion unit configured to be disposed on a semiconductor substrate and to generate charge corresponding to incident light by photoelectric conversion, a charge holding unit configured to hold the charge, a charge transfer unit configured to include an opening portion, which is formed in the semiconductor substrate and having a polygonal shape in a plan view, and an embedded gate disposed in the opening portion and to transfer the charge from the photoelectric conversion unit to the charge holding unit, and an image signal generation unit configured to generate an image signal based on the held charge.

Further, in the first aspect, the charge transfer unit may include the opening portion having a polygonal shape with six or more sides.

Further, in the first aspect, the charge transfer unit may include the opening portion having a polygonal shape in which an interior angle of a vertex is 120 to 150 degrees.

Further, in the first aspect, the charge transfer unit may include the opening portion having an octagonal shape.

Further, in the first aspect, the charge transfer unit may include the opening portion having a polygonal shape which is formed by performing recrystallization of a member constituting the semiconductor substrate.

Further, in the first aspect, the photoelectric conversion unit may include a boundary surface parallel to a side of the polygon of the opening portion of the charge transfer unit.

Further, in the first aspect, the charge holding unit may include a boundary surface parallel to a side of the polygon of the opening portion of the charge transfer unit.

Further, in the first aspect, the charge transfer unit may further include a gate insulating film disposed between the semiconductor substrate and the embedded gate.

Further, in the first aspect, the charge transfer unit may include the gate insulating film formed by oxidizing the semiconductor substrate.

Further, in the first aspect, the charge transfer unit may include the gate insulating film formed by oxidizing the semiconductor substrate with oxygen radicals.

Further, in the first aspect, the semiconductor substrate may be formed of silicon.

Further, in the first aspect, the charge transfer unit may further include a high impurity concentration region which is disposed on the semiconductor substrate adjacent to the opening portion and configured to have a high impurity concentration.

Further, in the first aspect, the charge transfer unit may further include a substrate surface gate which is adjacent to the embedded gate and configured to have a shape covering the high impurity concentration region on a front surface side of the semiconductor substrate.

Further, in the first aspect, the imaging element may further include a second high impurity concentration region which is adjacent to the photoelectric conversion unit, disposed on a front surface side of the semiconductor substrate, and configured to have a high impurity concentration.

In addition, a second aspect of the present disclosure is an imaging device including a photoelectric conversion unit configured to be disposed on a semiconductor substrate and to generate charge corresponding to incident light by photoelectric conversion, a charge holding unit configured to hold the charge, a charge transfer unit configured to include an opening portion, which is formed in the semiconductor substrate and having a polygonal shape in a plan view, and an embedded gate disposed in the opening portion and to transfer the charge from the photoelectric conversion unit to the charge holding unit, an image signal generation unit configured to generate an image signal based on the held charge, and a processing circuit configured to process the generated image signal.

According to the aspects of the present disclosure, an effect of forming a channel along an opening portion having a polygonal shape in a charge transfer unit section is obtained.

DESCRIPTION OF EMBODIMENTS

Figure 1:
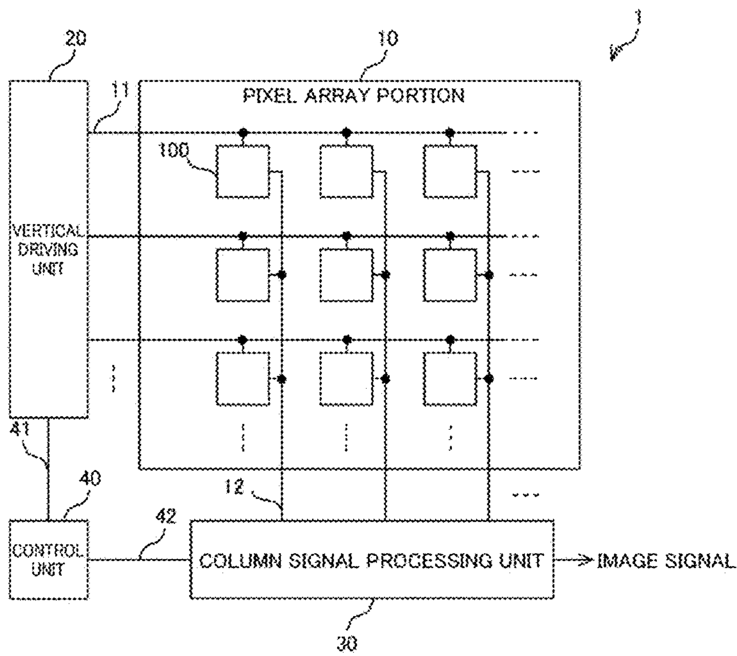
FIG. 1 is a diagram illustrating a configuration example of an imaging element according to an embodiment of the present disclosure.

Next, embodiments for implementing the present disclosure (hereinafter referred to as embodiments) will be described with reference to the drawings. In the following drawings, the same or similar portions are denoted by the same or similar reference numerals and signs. In addition, the embodiments will be described in the following order.

1. First embodiment
2. Second embodiment
3. Third embodiment
4. Example of application to camera
5. Application example to endoscopic operation system
6. Example of application to moving body

1. First Embodiment

[Configuration of Imaging Element]

FIG. 1 is a diagram illustrating a configuration example of an imaging element according to an embodiment of the present disclosure. In the drawing, an imaging element 1 includes a pixel array portion 10, a vertical driving unit 20, a column signal processing unit 30, and a control unit 40.

The pixel array portion 10 is configured with pixels 100 disposed in a two-dimensional lattice shape. Here, the pixels 100 generate image signals in response to emitted light. Each of the pixels 100 includes a photoelectric conversion unit that generates charge in response to the emitted light. In addition, each of the pixels 100 further includes a pixel circuit. The pixel circuit generates an image signal based on charge generated by the photoelectric conversion unit. The generation of the image signal is controlled by a control signal generated by the vertical driving unit 20, which will be described later. Signal lines 11 and 12 are disposed in an XY matrix form in the pixel array portion 10. The signal line 11 is a signal line through which a control signal of the pixel circuit in the pixels 100 is transmitted, is disposed for each row of the pixel array portion 10, and is wired in common for pixels 100 disposed in each row. The signal line 12 is a signal line through which an image signal generated by the pixel circuit of the pixel 100 is transmitted, is disposed for each column of the pixel array portion 10, and is wired in common for pixels 100 disposed in each column. The photoelectric conversion unit and the pixel circuit are formed on a semiconductor substrate.

The vertical driving unit 20 generates a control signal of the pixel circuit of the pixel 100. The vertical driving unit 20 transmits the generated control signal to the pixels 100 through the signal lines 11 in the drawing. The column signal processing unit 30 processes an image signal generated by the pixels 100. The column signal processing unit 30 processes an image signal transmitted from the pixels 100 through the signal lines 12 in the drawing. Processing in the column signal processing unit 30 corresponds to, for example, analog-to-digital conversion of converting an analog image signal generated in the pixels 100 into a digital image signal. The image signal processed by the column signal processing unit 30 is output as an image signal of the imaging element 1. The control unit 40 controls the overall imaging element 1. The control unit 40 generates and outputs control signals for controlling the vertical driving unit 20 and the column signal processing unit 30 to control the imaging element 1. The control signals generated by the control unit 40 are transmitted to the vertical driving unit 20 and the column signal processing unit 30 through signal lines 41 and 42. Meanwhile, the column signal processing unit 30 is an example of a processing circuit described in the claims.

[Configuration of Pixel]

Figure 2:
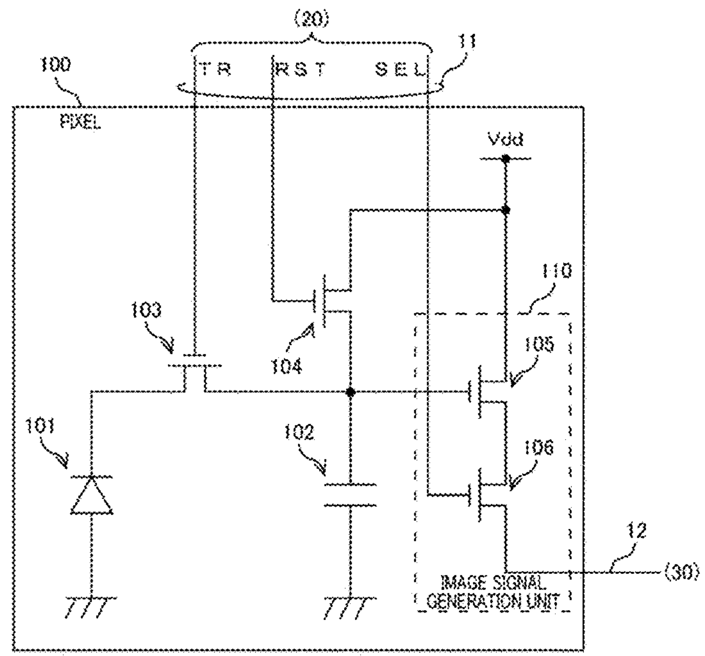
FIG. 2 is a diagram illustrating a configuration example of a pixel according to the embodiment of the present disclosure.

FIG. 2 is a diagram illustrating a configuration example of the pixel according to the embodiment of the present disclosure. The drawing is a circuit diagram illustrating a configuration example of the pixel 100. The pixel 100 in the drawing includes a photoelectric conversion unit 101, a charge holding unit 102, a charge transfer unit 103, and MOS transistors 104 to 106. Note that the charge transfer unit 103 can be constituted by a MOS transistor. An n-channel MOS transistor can be used for the charge transfer unit 103 and the MOS transistors 104 to 106.

An anode of the photoelectric conversion unit 101 is grounded, and a cathode is connected to a source of the charge transfer unit 103. A drain of the charge transfer unit 103 is connected to a source of the MOS transistor 104, a gate of the MOS transistor 105, and an end of the charge holding unit 102. The other end of the charge holding unit 102 is grounded. Both the drains of the MOS transistors 104 and 105 are connected to a power supply line Vdd, and a source of the MOS transistor 105 is connected to a drain of the MOS transistor 106. A source of the MOS transistor 106 is connected to a signal line 12. Gates of the charge transfer units 103, 104, and 106 are respectively connected to a transfer signal line TR, a reset signal line RST, and a selection signal line SEL. Note that the transfer signal line TR, the reset signal line RST, and the selection signal line SEL constitute the signal line 11.

The photoelectric conversion unit 101 generates charge corresponding to emitted light as described above. A photodiode can be used for the photoelectric conversion unit 101.

In addition, the charge holding unit 102 and the MOS transistors 103 to 106 constitute a pixel circuit.

The charge transfer unit 103 is a transistor that transfers charge generated by photoelectric conversion of the photoelectric conversion unit 101 to the charge holding unit 102. The transfer of charge in the charge transfer unit 103 is controlled by a signal transmitted through the transfer signal line TR. The charge holding unit 102 is a capacitor that holds charge transferred by the charge transfer unit 103.

The MOS transistor 105 is a transistor that generates a signal based on charge held in the charge holding unit 102. The MOS transistor 106 is a transistor that outputs the signal generated by the MOS transistor 105 to the signal line 12 as an image signal. The MOS transistor 106 is controlled by a signal transmitted through the selection signal line SEL. In this manner, the MOS transistors 105 and 106 generate an image signal based on charge held in the charge holding unit 102. The circuit of the MOS transistors 105 and 106 constitutes an image signal generation unit 110.

The MOS transistor 104 is a transistor that resets the charge holding unit 102 by discharging the charge held in the charge holding unit 102 to a power supply line Vdd. The reset performed by the MOS transistor 104 is controlled by a signal transmitted through the reset signal line RST, and is executed before the charge is transferred by the charge transfer unit 103. Note that, at the time of the reset, it is also possible to reset the photoelectric conversion unit 101 by setting the charge transfer unit 103 in an electrically conducting state. In this manner, the pixel circuit converts charge generated by the photoelectric conversion unit 101 into an image signal.

[Configuration of Cross Section of Pixel]

Figure 3:
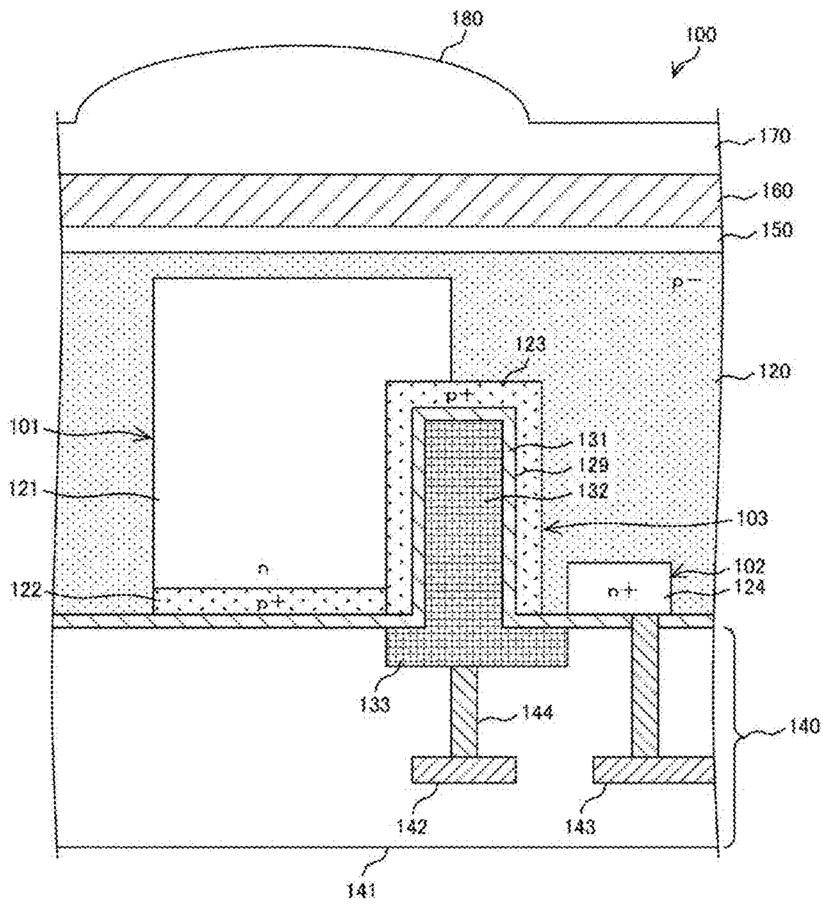
FIG. 3 is a cross-sectional view illustrating a configuration example of the pixel according to a first embodiment of the present disclosure.

FIG. 3 is a cross-sectional view illustrating a configuration example of the pixel according to the first embodiment of the present disclosure. The drawing is a schematic cross-sectional view illustrating a configuration example of the pixel 100. In the drawing, the pixel 100 includes a semiconductor substrate 120, a wiring region 140, an insulating film 150, a color filter 160, a protection film 170, and an on-chip lens 180.

The semiconductor substrate 120 is a semiconductor substrate on which diffusion regions of the photoelectric conversion unit 101, the MOS transistor, and the like are formed. As the semiconductor substrate 120, a substrate formed of, for example, silicon (Si) can be used. The photoelectric conversion unit 101 and the like are disposed in a well region formed in the semiconductor substrate 120. For convenience, it is assumed that the semiconductor substrate 120 in the drawing is configured in a p-type well region. By forming an n-type semiconductor region in the p-type well region, it is possible to form the photoelectric conversion unit 101 and the like. A white region of the semiconductor substrate 120 in the drawing represents an n-type semiconductor region.

In the semiconductor substrate 120 in the drawing, the photoelectric conversion unit 101, the charge holding unit 102, and the charge transfer unit 103 are illustrated as examples. The photoelectric conversion unit 101 is constituted by an n-type semiconductor region 121. Specifically, a photodiode configured using a pn junction of an interface between the n-type semiconductor region 121 and a p-type well region in the periphery thereof corresponds to the photoelectric conversion unit 101. Charge generated by photoelectric conversion is accumulated in the n-type semiconductor region 121. Note that a p-type semiconductor region 122 formed to have a relatively high impurity concentration is disposed between the n-type semiconductor region 121 and the surface of the semiconductor substrate 120 on the front surface side. The p-type semiconductor region 122 is a semiconductor region for pinning a surface level on the front surface side of the semiconductor substrate 120 adjacent to the semiconductor region 121. It is possible to reduce a dark current caused by the surface level of the semiconductor substrate 120 by disposing the semiconductor region 122. Note that the semiconductor region 122 is an example of a second high impurity concentration region described in the claims.

The charge holding unit 102 is constituted by an n-type semiconductor region 124. The n-type semiconductor region 124 is a region which is configured to have a relatively high impurity concentration and in which charge generated by photoelectric conversion and accumulated in the n-type semiconductor region 121 is held. The charge holding unit 102 constituted by the semiconductor region 124 is referred to as a floating diffusion. The n-type semiconductor region 124 is connected to the image signal generation unit 110 through a wiring layer 143 to be described later.

The charge transfer unit 103 is a MOS transistor which is disposed between the n-type semiconductor region 121 constituting the photoelectric conversion unit 101 and the n-type semiconductor region 124 constituting the charge holding unit 102 and transfers charge accumulated in the n-type semiconductor region 121 to the n-type semiconductor region 124. The charge transfer unit 103 includes an embedded gate 132 that is configured to be embedded in an opening portion 129 formed in the semiconductor substrate 120. The embedded gate 132 is disposed adjacent to the opening portion 129 of the semiconductor substrate 120 through a gate insulating film 131. A channel is formed in a well region of the semiconductor substrate 120 along the opening portion 129. A MOS transistor including such an embedded gate 132 is referred to as a vertical transistor. It is possible to improve the transfer efficiency of charge from the n-type semiconductor region 121 disposed in a relatively deep region of the semiconductor substrate 120.

In addition, a p-type semiconductor region 123 configured to have a relatively high impurity concentration is disposed in the semiconductor substrate 120 adjacent to the opening portion 129. The p-type semiconductor region 123 is a region for pinning the surface level of the semiconductor substrate 120 of the opening portion 129. The semiconductor region 123 can be formed by injecting an acceptor such as boron (B) into the semiconductor substrate 120. Note that the semiconductor region 123 is an example of a high impurity concentration region described in the claims.

In addition, a substrate surface gate 133 can be disposed adjacent to the embedded gate 132. The substrate surface gate 133 is a gate disposed on the front surface side of the semiconductor substrate 120 and is a gate configured to have a shape that covers the opening portion 129. In addition, the substrate surface gate 133 in the drawing is configured to have a shape that covers the p-type semiconductor region 123. A gate insulating film 131 is disposed between the substrate surface gate 133 and the front surface side of the semiconductor substrate 120, similarly to the embedded gate 132. A channel is formed in the semiconductor substrate 120 immediately below the substrate surface gate 133.

The opening portion 129 can be formed by etching the surface of the semiconductor substrate 120. As will be described later, the opening portion 129 is configured as a polygon in a plan view.

The gate insulating film 131 can be formed of, for example, $SiO_2$. The $SiO_2$ can be formed by oxidizing Si on the surface of the opening portion 129.

The embedded gate 132 and the substrate surface gate 133 can be formed of, for example, polycrystalline silicon or amorphous silicon. The embedded gate 132 can be formed by disposing polycrystalline silicon or the like in the opening portion 129. As described above, the opening portion 129 is configured as a polygon in a plan view, and thus the external form of the embedded gate 132 disposed in the opening portion 129 is also configured as a polygon in a plan view. In addition, the embedded gate 132 and the substrate surface gate 133 can be formed at the same time.

The wiring region 140 is a region where wiring, which is disposed on the front surface side of the semiconductor substrate 120 and transmits signals to the elements of the semiconductor substrate 120, is disposed. The wiring region 140 includes wiring layers 142 and 143 and an insulating layer 141. The wiring layers 142 and 143 are wirings that transmit signals to the elements of the semiconductor substrate 120. The wiring layer 142 or the like can be formed of a metal such as copper (Cu), tungsten (W), or the like. The wiring layer 142 is a wiring which is connected to the gate (substrate surface gate 133) of the charge transfer unit 103, and the wiring layer 143 is a wiring which is connected to the semiconductor region 124 of the charge holding unit 102. Although not illustrated in the drawing, wiring layers constituting other wirings are also disposed in the wiring region 140. The insulating layer 141 insulates the wiring layer 142 and the like. The insulating layer 141 can be formed of, for example, $SiO_2$. The semiconductor region of the semiconductor substrate 120 constituting the element, the gate of the charge transfer unit 103, the wiring layer 142, and the like can be connected to each other by a contact plug 144. The contact plug 144 is formed of a metal column.

The insulating film 150 is a film disposed on the rear surface side of the semiconductor substrate 120 to protect the semiconductor substrate 120. The insulating film 150 can be formed of, for example, $SiO_2$.

The color filter 160 is an optical filter that transmits light having a predetermined wavelength in incident light. As the color filter 160, three types of color filters that transmit, for example, red light, green light, and blue light can be used. In the pixel 100, one of the three types of color filters 160 is disposed.

The protection film 170 is a film that protects the rear surface side of the pixel 100 in which the color filters 160 are disposed. The protection film 170 can be formed of the same material as the on-chip lens 180 to be described later.

The on-chip lens 180 is a lens which is disposed for each pixel 100 to focus incident light on the photoelectric conversion unit. The on-chip lens 180 in the drawing is configured in a hemispherical shape to focus incident light. The on-chip lens 180 can be formed of an inorganic material such as silicon nitride (SiN) or an organic material such as an acrylic resin.

As described above, the photoelectric conversion unit 101 of the pixel 100 receives incident light from the rear surface side of the semiconductor substrate 120. The imaging element 1 including such a pixel 100 is referred to as a backside irradiation type imaging element.

As described above, the substrate surface gate 133 can be disposed in the charge transfer unit 103. By disposing the substrate surface gate 133, it is possible to reduce the influence of a potential barrier formed between the photoelectric conversion unit 101 and the charge transfer unit 103. In an exposure period, the charge transfer unit 103 is set to be in an electrical non-conduction state to accumulate charge in the semiconductor region 121 of the photoelectric conversion unit 101. In this case, for example, a negative voltage is applied to the gate (embedded gate 132) of the charge transfer unit 103, and the charge transfer unit 103 has a higher potential than the semiconductor region 121. When charge of the photoelectric conversion unit 101 is transferred after the exposure period has elapsed, a positive voltage is applied to the gate of the charge transfer unit 103. The potential of the charge transfer unit 103 becomes lower than that of the semiconductor region 121, and the charge of the semiconductor region 121 is moved to the charge transfer unit 103 and transferred.

However, in the charge transfer unit 103, the p-type semiconductor region 123 for pinning is disposed, and a relatively high potential barrier is formed. When the charge transfer unit 103 is set to be in an electrical conduction state, the potential barrier remains between the charge transfer unit 103 and the photoelectric conversion unit 101 to inhibit the movement of charge. Consequently, the substrate surface gate 133 is disposed to be configured in a shape that covers the p-type semiconductor region 123. By applying a voltage to the substrate surface gate 133, a voltage is also applied to the semiconductor region 123 immediately below the substrate surface gate 133, and a potential barrier can be lowered. The movement of charge is not inhibited, and the transfer efficiency of charge can be improved.

In addition, the substrate surface gate 133 is configured in a shape that covers the p-type semiconductor region 123, and thus it is possible to reduce an electric field intensity of the surface of the semiconductor substrate 120 in the vicinity of the gate of the charge transfer unit 103. When the size of the pixel 100 is reduced, the charge transfer unit 103 and the charge holding unit 102 approach each other. Since the p-type semiconductor region 123 is configured to have a relatively high impurity concentration, an electric field suddenly changes at an interface between the semiconductor region 123 and the semiconductor region 124 of the charge holding unit 102, thereby causing a tunnel effect and increasing a leakage current. Consequently, the substrate surface gate 133 is disposed in the vicinity of a boundary of the semiconductor region 123 to apply a voltage, and thus it is possible to alleviate a sudden change in an electric field in the vicinity of the surface of the semiconductor substrate 120. Accordingly, a leakage current can be reduced.

[Configuration of Surface of Pixel]

Figure 4:
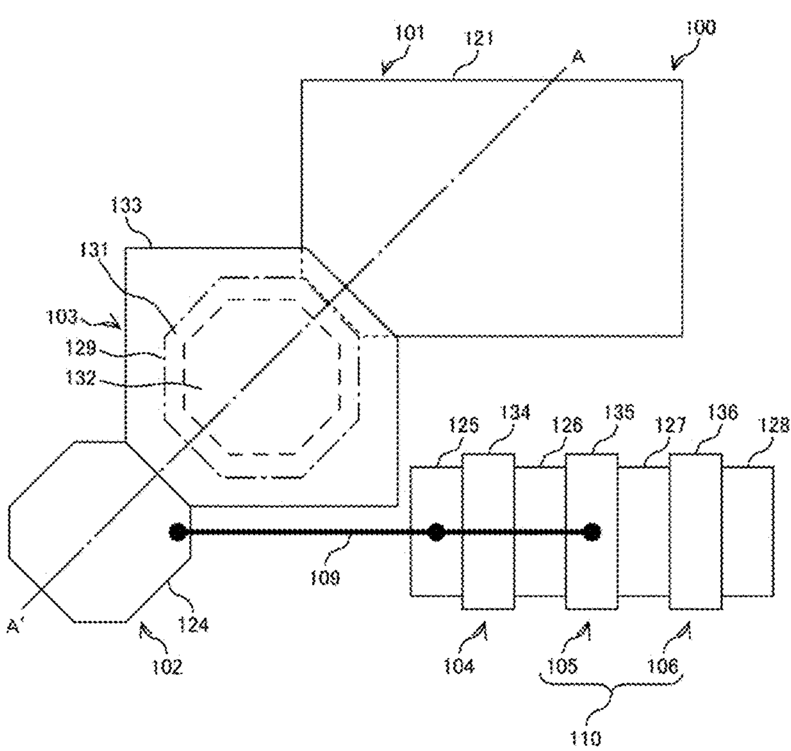
FIG. 4 is a plan view illustrating a configuration example of the pixel according to the first embodiment of the present disclosure.

FIG. 4 is a plan view illustrating a configuration example of the pixel according to the first embodiment of the present disclosure. The drawing is a plan view illustrating a configuration example of the pixel 100 and is a plan view from the front surface side of the semiconductor substrate 120. Note that FIG. 3 corresponds to a sectional view along a line A-A' in the drawing.

In the drawing, the semiconductor region 121 of the photoelectric conversion unit 101 is disposed on the upper right side, and the semiconductor region 124 of the charge holding unit 102 is disposed on the lower left side. The charge transfer unit 103 is disposed between the photoelectric conversion unit 101 and the charge holding unit 102. A solid polygon of the charge transfer unit 103 represents the substrate surface gate 133. An alternating dotted-dashed polygon represents the opening portion 129. A dashed polygon represents the embedded gate 132. The opening portion 129 and the embedded gate 132 in the drawing indicate an example configured to have an octagon in a plan view. Here, the plan view represents a view from a direction perpendicular to the surface of the semiconductor substrate 120. The opening portion 129 and the like are configured to have a polygonal shape on a surface parallel to the surface of the semiconductor substrate 120.

In addition, the MOS transistors 104 to 106 described in FIG. 2 are disposed on the lower right side in the drawing. The MOS transistor 104 is constituted by semiconductor regions 125 and 126 and a gate 134. The semiconductor regions 125 and 126 correspond to a source region and a drain region, respectively. The MOS transistor 105 is constituted by the semiconductor regions 126 and 127 and a gate 135. The semiconductor regions 126 and 127 correspond to a drain region and a source region, respectively. The MOS transistor 106 is constituted by the semiconductor regions 127 and 128 and a gate 136. The semiconductor regions 127 and 128 correspond to a drain region and a source region, respectively. Note that the gates 134 to 136 are gates constituted by an electrode disposed on the front surface side of the semiconductor substrate 120, similarly to the substrate surface gate 133.

The semiconductor region 125 constituting the source region of the MOS transistor 104 and the gate 135 of the MOS transistor 105 are connected to the semiconductor region 124 constituting the charge holding unit 102. The wiring 109 in the drawing represents a wiring for connecting these and is a wiring constituted by the wiring layer 143 described in FIG. 3. In addition, black circles in the drawing represent connection portions with the wiring 109, the semiconductor region 124, and the like. A contact plug is disposed in the connection portion. As described above, the MOS transistors 105 and 106 constitute the image signal generation unit 110.

Note that it is possible to adopt a configuration in which the charge holding unit 102 and the MOS transistors 104 to 106 are shared by the plurality of pixels 100. As illustrated in the drawing, the charge transfer unit 103 and the photoelectric conversion unit 101 are disposed in one of long sides of the semiconductor region 124 having an octagonal shape. It is possible to adopt a configuration in which four pixels 100 share the charge holding unit 102, the MOS transistor 104, and the image signal generation unit 110 by disposing the charge transfer unit 103 and the photoelectric conversion unit 101 in each of the other three long sides of the semiconductor region 124.

The opening portion 129 configured into a polygon in a plan view can be formed by recrystallizing Si in an inner wall of the opening portion formed in the semiconductor substrate 120. Specifically, a circular opening portion is formed on the front surface side of the semiconductor substrate 120 and heated to several hundred degrees. The heating causes migration of Si of the semiconductor substrate 120. The migrated Si precipitates on the side surface of the opening portion and recrystallizes. At the time of recrystallization, a plane (a 100 plane or a 110 plane) having a specific orientation is grown, and thus the opening portion 129 having a polygonal cross section surrounded by the plane can be formed.

The semiconductor substrate can be heated immediately before a step of forming the gate insulating film 131 in the opening portion 129. As described above, the gate insulating film 131 can be formed by oxidizing the surface of the semiconductor substrate 120 including the opening portion 129. Since the semiconductor substrate 120 is heated in the oxidation step, it is possible to simplify a step of manufacturing the imaging element 1 by continuously performing the step of forming the inner wall of the opening portion 129 into a polygon and the oxidation step. As a method of oxidizing the semiconductor substrate 120, radical oxidation and plasma oxidation can be applied. These are oxidation methods for oxidizing the semiconductor substrate 120 with oxygen radicals.

[Effects of Embedded Gate]

Figure 5:
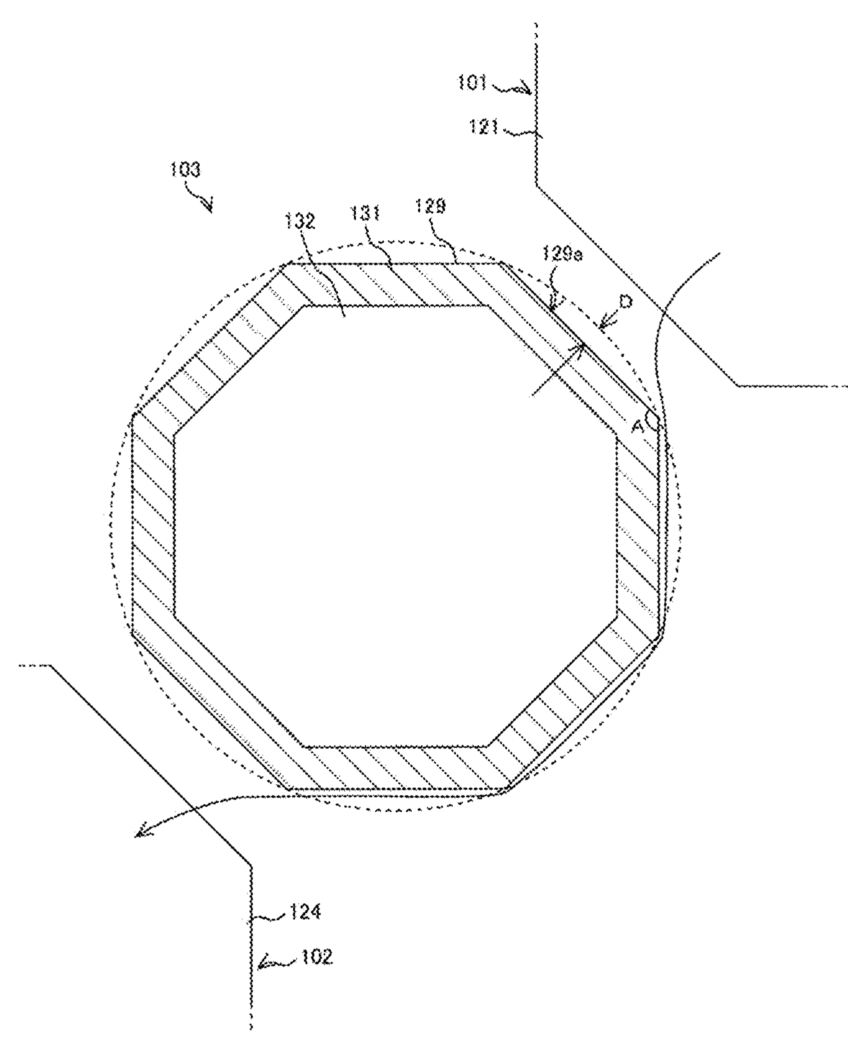
FIG. 5 is a plan view illustrating a configuration example of an embedded gate according to the first embodiment of the present disclosure.
Figure 6:
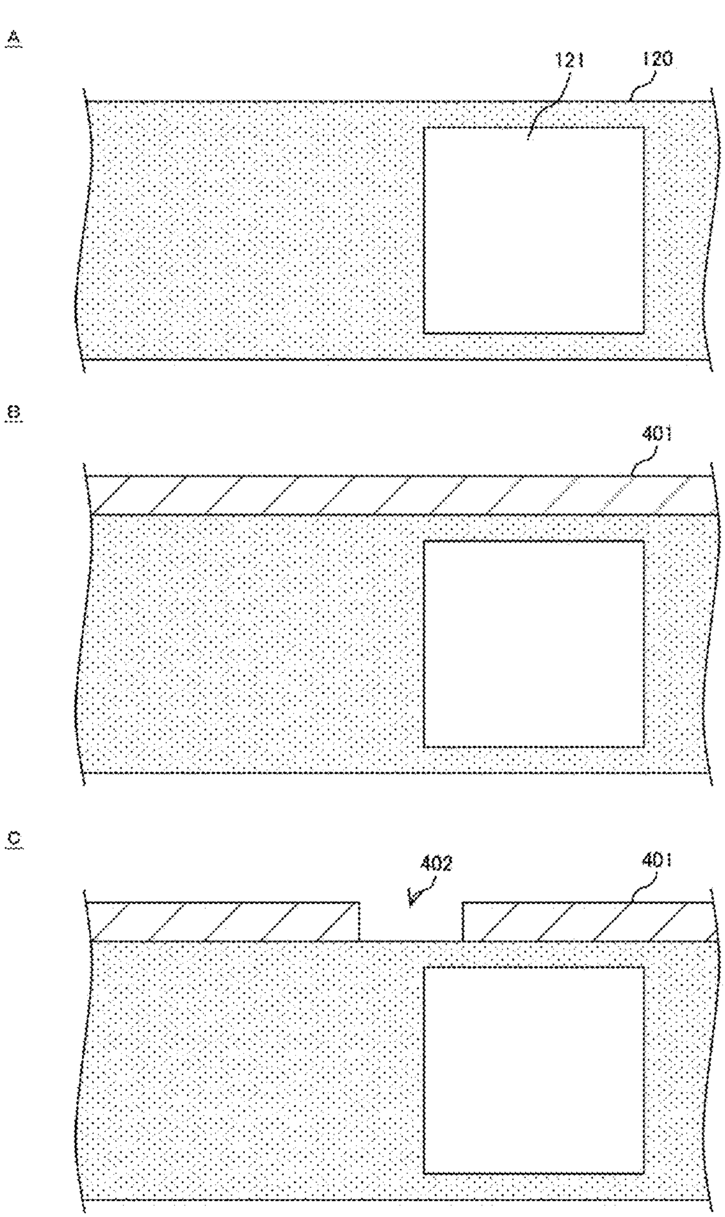
FIG. 6 is a diagram illustrating an example of a method of manufacturing the pixel according to the first embodiment of the present disclosure.
Figure 7:
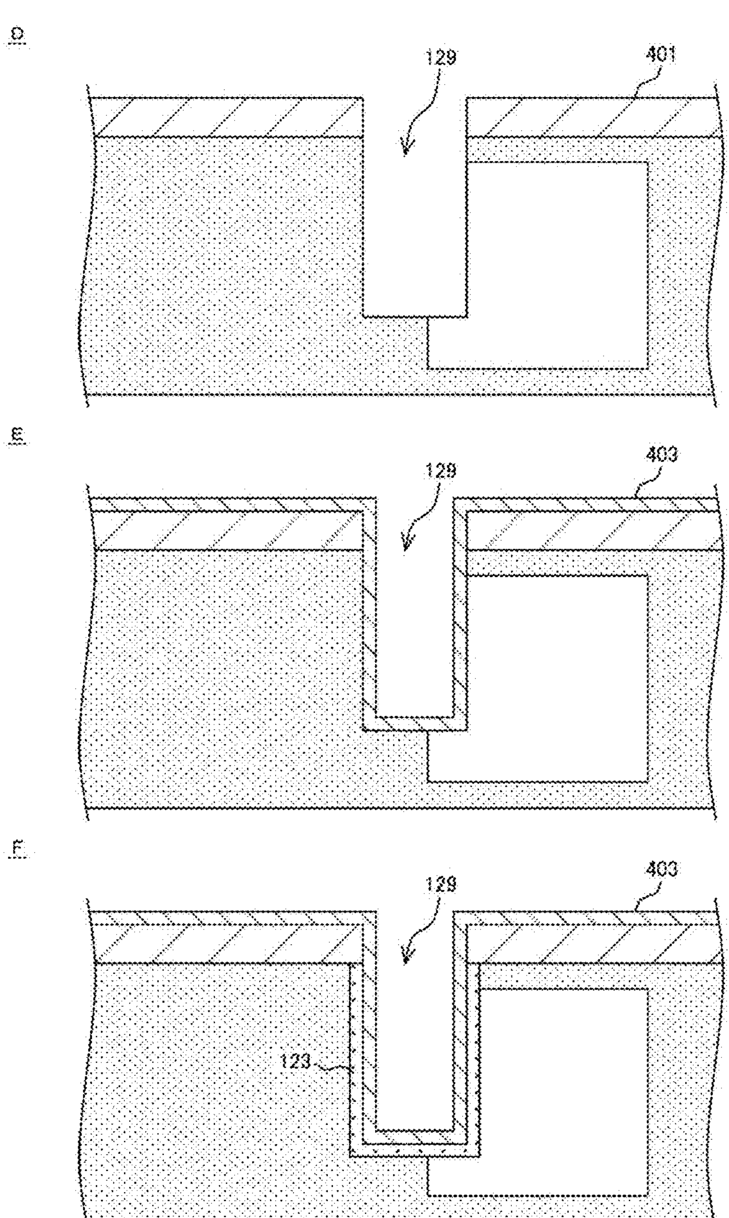
FIG. 7 is a diagram illustrating an example of a method of manufacturing the pixel according to the first embodiment of the present disclosure.

FIG. 5 is a plan view illustrating a configuration example of the embedded gate according to the first embodiment of the present disclosure. The drawing is an enlarged view of a portion of the embedded gate 132 of the charge transfer unit 103 described in FIG. 4. In the drawing, a hatched region represents the gate oxide film 131. Note that the description of the substrate surface gate 133 is omitted. As described above, the opening portion 129 can be configured in an octagonal shape in a plan view. The gate insulating film 131 formed along the inner wall of the opening portion 129 is also have an octagonal shape, and the external form of the embedded gate 132 is also an octagonal shape.

When charge of the semiconductor region 121 of the photoelectric conversion unit 101 is transferred to the semiconductor region 124 of the charge holding unit 102, the charge is moved along a channel formed on the outer side of the opening portion 129. Since the channel is formed along the octagonal external form of the opening portion 129, the charge from the semiconductor region 121 moves along the octagonal external form of the opening portion 129. A dashed line in the drawing assumes a circle circumscribing the octagonal opening portion 129 and represents the opening portion 129 in a case of being formed in a circular shape in a plan view. In addition, a curved arrow in the drawing represents an example of a charge moving path.

As illustrated in the drawing, the sides of the octagon are shorter than the circumference of the circumscribed circle, and thus the charge transfer unit 103 including the octagonal opening portion 129 and the embedded gate 132 embedded in the opening portion can have a reduced charge transfer path as compared with a case where the charge transfer unit 103 includes a gate embedded in a circular opening portion. Thereby, it is possible to reduce time required to transfer charge. In addition, a charge transfer path is expanded by forming the opening portion 129 in an octagonal shape. This is because the above-described channel is expanded from the circumference illustrated in the drawing to the position of the side of the octagon. Thereby, it is possible to improve the transfer efficiency of charge in the charge transfer unit 103.

In addition, the opening portion 129 is configured in an octagonal shape in a plan view, and thus it is possible to reduce the area of the inner surface of the opening portion 129, as compared to a case where the opening portion 129 is configured in a circular shape. Thereby, it is possible to reduce a defect of the semiconductor substrate 120 formed in the opening portion 129. It is possible to reduce the surface level of the opening portion 129 and reduce the generation of a dark current.

Such effects can be obtained by configuring the opening portion 129 in a polygonal shape with six or more sides in a plan view. On the other hand, in a case where the opening portion 129 is configured into a quadrangle or a pentagon in a plan view, an electric field is concentrated on the gate insulating film 131 in a vertex portion of the opening portion 129, which leads to a possibility that a defect such as breakage will occur. This is because the vertex of the opening portion 129 has a small angle. The angle of the vertex of the opening portion 129 can be set to 120 to 150 degrees. Thereby, it is possible to alleviate the concentration of an electric field on the gate insulating film 131 in the vertex portion of the opening portion 129.

In addition, it is possible to widen an interval with respect to the semiconductor region 121 of the photoelectric conversion unit 101 by configuring the opening portion 129 into a polygon. "D" illustrated in the drawing represents an increase in the interval between the opening portion 129 and the semiconductor region 121 compared with a circular opening portion 129. By widening an interval with respect to the semiconductor region 121 of the photoelectric conversion unit 101, it is possible to widen an interval between a boundary of the p-type semiconductor region 123 (not illustrated) in the vicinity of the opening portion 129 and the semiconductor region 121. As described above, the substrate surface gate 133 is disposed in a shape that covers the semiconductor region 123. It is possible to reduce the influence of a potential barrier at an interface with the photoelectric conversion unit 101 by the substrate surface gate 133. It is possible to more reduce the influence of a potential barrier by relatively widening an interval between the boundary of the semiconductor region 123 and the semiconductor region 121.

Similarly, the opening portion 129 is configured into a polygon, and thus it is possible to relatively widening an interval between the boundary of the semiconductor region 123 and the semiconductor region 124 and improve the above-described effect of alleviating an electric field that changes suddenly.

The position of the side of the opening portion 129 configured into a polygon is made parallel to the interface with the semiconductor region 121 of the photoelectric conversion unit 101, and thus an interval between the boundary of the semiconductor region 123 and the semiconductor region 121 can be made widest. This can be performed by forming an orientation plane in a direction parallel to the boundary of the semiconductor region 121. An orientation plane 129*a* in the drawing represents an orientation plane in a direction parallel to the boundary of the semiconductor region 121. For example, a 100 plane of Si is grown as the orientation plane 129*a*, and thus the position of the side of the opening portion 129 can be made parallel to the boundary of the semiconductor region 121.

Such an orientation plane 129*a* can be formed, for example, by adjusting the orientation of a wafer-shaped semiconductor substrate 120 on the front surface side and the orientation of an orientation flat plane. For example, by using a wafer of which the front surface side is a 100 plane and configuring an orientation flat plane as a 100 plane, a 100 plane can be formed on the surface of an opening portion perpendicular or parallel to the orientation flat. Then, the boundary of the semiconductor region 121 is disposed in a direction perpendicular or parallel to the orientation flat, and thus a 100 plane which is the orientation plane parallel to the boundary of the semiconductor region 121 can be formed in the opening portion 129 close to the semiconductor region 121. In this case, an orientation plane of a 110 plane is formed on a surface adjacent to the orientation plane 129*a* configured on a 100 plane of the opening portion 129. "A" illustrated in the drawing represents an angle formed by these planes. A can be set to 120 to 150 degrees.

Similarly, the position of the side of the opening portion 129 configured into a polygon can be made parallel to an interface with the semiconductor region 124 of the charge holding unit 102. In this case, it is possible to widen an interval between the boundary of the semiconductor region 123 and the semiconductor region 124 and improve the above-described effect of alleviating a change in an electric field.

[Method of Manufacturing Pixel]

FIGS. 6 to 9 are diagrams illustrating an example of a method of manufacturing the pixel according to the first embodiment of the present disclosure. First, a p-type well region is formed in the semiconductor substrate 120. Next, the n-type semiconductor region 121 is formed in the well region (A in FIG. 6).

Next, a silicon-based insulating film 401 is formed on the front surface side of the semiconductor substrate 120. The silicon-based insulating film 401 is an insulating film configured by laminating SiN and $SiO_2$, and is a film serving as a mask at the time of forming the opening portion 129 in the semiconductor substrate 120. The silicon-based insulating film 401 can be formed through chemical vapor deposition (CVD) (B in FIG. 6).

Next, an opening portion 402 is formed in the silicon-based insulating film 401 in a region where the opening portion 129 is formed. This can be formed by disposing a resist having an opening portion at the position of the opening portion 402 on the surface of the silicon-based insulating film 401 and performing etching (C in FIG. 6).

Next, the opening portion 129 is formed. This can be performed by etching the front surface side of the semiconductor substrate 120 by using the silicon-based insulating film 401 as a mask. Dry etching can be applied to the etching. The formed opening portion 129 is configured, for example, in a circular shape (D in FIG. 7).

Next, a sacrificial oxide film 403 is formed on the surface of the silicon-based insulating film 401 and the inner wall of the opening portion 129. The sacrificial oxide film 403 can be formed as follows. First, the semiconductor substrate 120 is heated while supplying an oxygen ($O_2$) gas and a hydrogen ($H_2$) gas. Oxygen radicals are generated by raising the temperature of the semiconductor substrate 120 to several hundred degrees in a state where gas is supplied. The surface of the semiconductor substrate 120 is oxidized with the oxygen radicals, and the sacrificial oxide film 403 is formed (E in FIG. 7).

Next, the semiconductor region 123 is formed. This can be performed by implanting boron (B) ions using the silicon-based insulating film 401 as a mask (F in FIG. 8).

Figure 8:
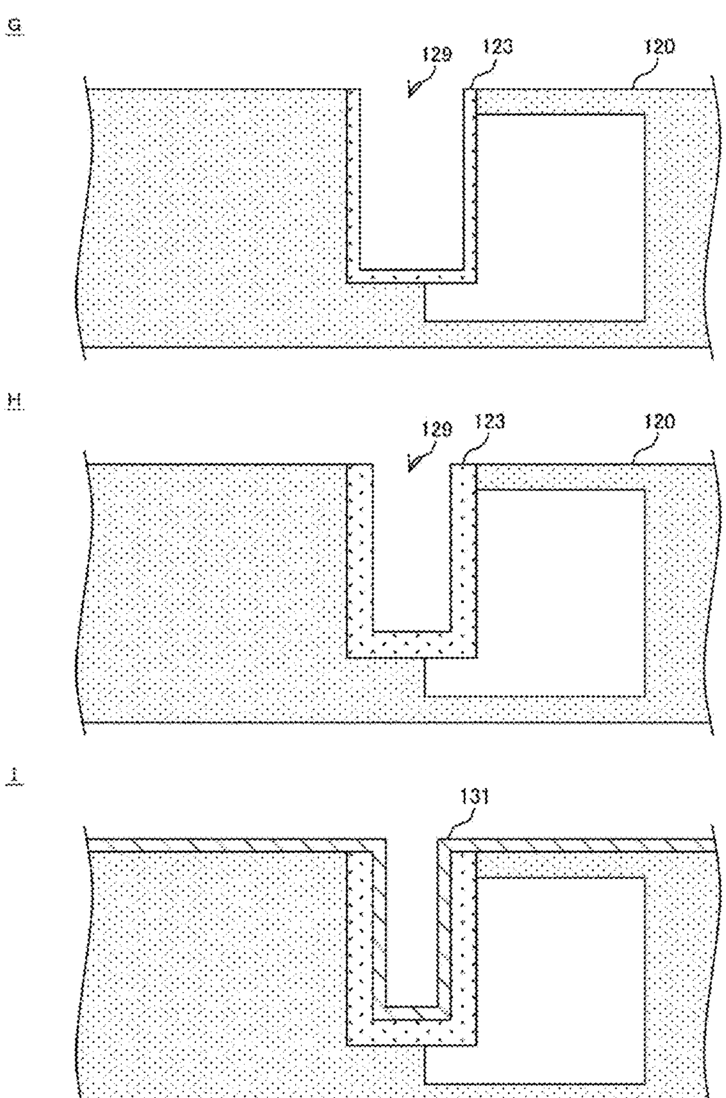
FIG. 8 is a diagram illustrating an example of a method of manufacturing the pixel according to the first embodiment of the present disclosure.
Figure 9:
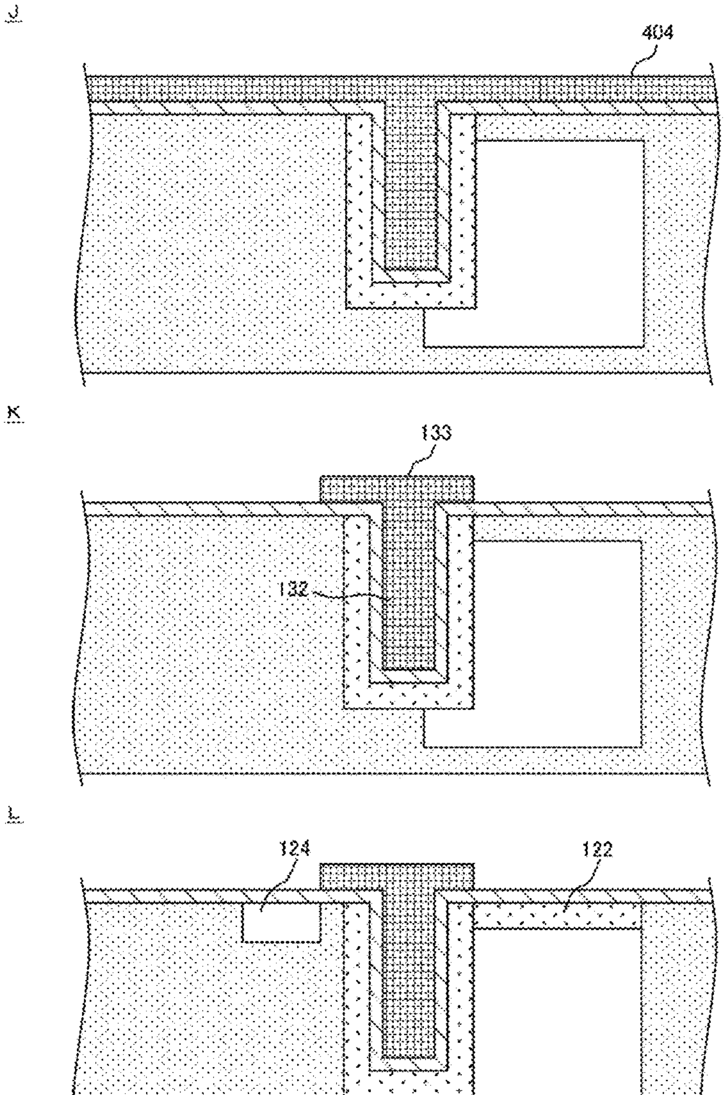
FIG. 9 is a diagram illustrating an example of a method of manufacturing the pixel according to the first embodiment of the present disclosure.

Next, the sacrificial oxide film 403 and the silicon-based insulating film 401 are removed using a chemical liquid such as hydrofluoric acid (G in FIG. 8).

Next, Si in the inner wall of the opening portion 129 is recrystallized. This can be performed by heating the semiconductor substrate 120. The semiconductor substrate 120 is heated to several hundred degrees and held, which leads to the migration of Si constituting the semiconductor substrate 120, and Si is recrystallized on the inner wall of the opening portion 129. Thereby, it is possible to form the opening portion 129 having a polygonal shape in a plan view. In addition, the opening portion 129 becomes narrow due to the recrystallization of Si (H in FIG. 8). At the time of the recrystallization of Si, it is preferable to supply $O_2$ gas or $O_2$ gas mixed with $H_2$ gas. This is because it can be used in combination with the next radical oxidation step.

Next, the gate insulating film 131 is formed by oxidizing Si on the front surface of the semiconductor substrate 120. As described above, radical oxidation can be applied to the oxidation of Si. Similarly to the above-described formation of the sacrificial oxide film 403, the gate insulating film 131 can be formed by heating the semiconductor substrate 120 to several hundred degrees while supplying $O_2$ gas or $O_2$ gas mixed with $H_2$ gas (I in FIG. 8).

Next, a polycrystalline silicon film 404 is disposed on the front surface side of the semiconductor substrate 120. In this case, the polycrystalline silicon film 404 is also disposed in the opening portion 129. This can be performed through CVD (J in FIG. 9).

Next, the polycrystalline silicon film 404 in a region other than the region of the substrate surface gate 133 on the front surface side of the semiconductor substrate 120 is removed. This can be performed by etching the polycrystalline silicon film 404. Thereby, the substrate surface gate 133 and the embedded gate 132 can be formed (K in FIG. 9).

Next, the semiconductor regions 122 and 124 are formed in the semiconductor substrate 120. This can be performed by ion implantation (L in FIG. 9).

Next, the wiring region 140 is formed on the front surface side of the semiconductor substrate 120. Next, the rear surface side of the semiconductor substrate 120 is ground to thin the semiconductor substrate 120. Next, the insulating film 150, the color filter 160, the protection film 170, and the on-chip lens 180 are sequentially formed on the rear surface side of the semiconductor substrate 120. Thereby, the imaging element 1 can be manufactured.

Note that the sacrificial oxide film 403 and the gate insulating film 131 can be formed by plasma oxidation for generating oxygen radicals using oxygen plasma to oxidize Si. In addition, the recrystallization of Si on the inner wall of the opening portion 129 can also be performed at the time of forming the sacrificial oxide film 403.

[Modification Example]

In the charge transfer unit 103 mentioned above, the gate insulating film 131 and the embedded gate 132 are disposed in the opening portion 129 having a regular octagonal shape in a plan view, but opening portions 129 having other shapes can also be applied.

Figure 10:
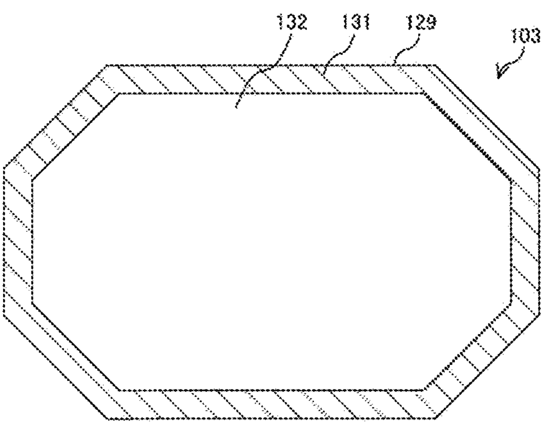
FIG. 10 is a plan view illustrating another configuration example of the pixel according to the first embodiment of the present disclosure.

FIG. 10 is a plan view illustrating another configuration example of the pixel according to the first embodiment of the present disclosure. The drawing is a diagram illustrating the shapes of the opening portion 129 and the like of the charge transfer unit 103, similarly to FIG. 5. The opening portion 129 in the drawing differs from the opening portion 129 in FIG. 5 in that the opening portion is configured in a flat octagonal shape. In a case where the opening portion of the semiconductor substrate 120 before the recrystallization of Si is performed is configured in an elliptic shape in a plan view, the opening portion 129 having a flat polygonal shape illustrated in the drawing can be formed. The embedded gate 132 having a flat octagonal shape can be formed by disposing the embedded gate 132 in the opening portion 129. A charge transfer path can also be reduced in the embedded gate 132 having a flat octagonal shape.

As described above, in the imaging element 1 according to the first embodiment of the present disclosure, the embedded gate 132 of the charge transfer unit 103 constituted by a vertical transistor is configured into a polygon in a plan view, and thus a charge transfer path of the charge transfer unit 103 can be reduced. Thereby, it is possible to improve the transfer efficiency of charge in the charge transfer unit 103.

2. Second Embodiment

In the above-described imaging element 1 of the first embodiment, the substrate surface gate 133 is disposed in the charge transfer unit 103 of the pixel 100. On the other hand, an imaging element 1 of a second embodiment of the present disclosure differs from that in the above-described first embodiment in that the substrate surface gate 133 is omitted.

[Configuration of Pixel]

Figure 11:
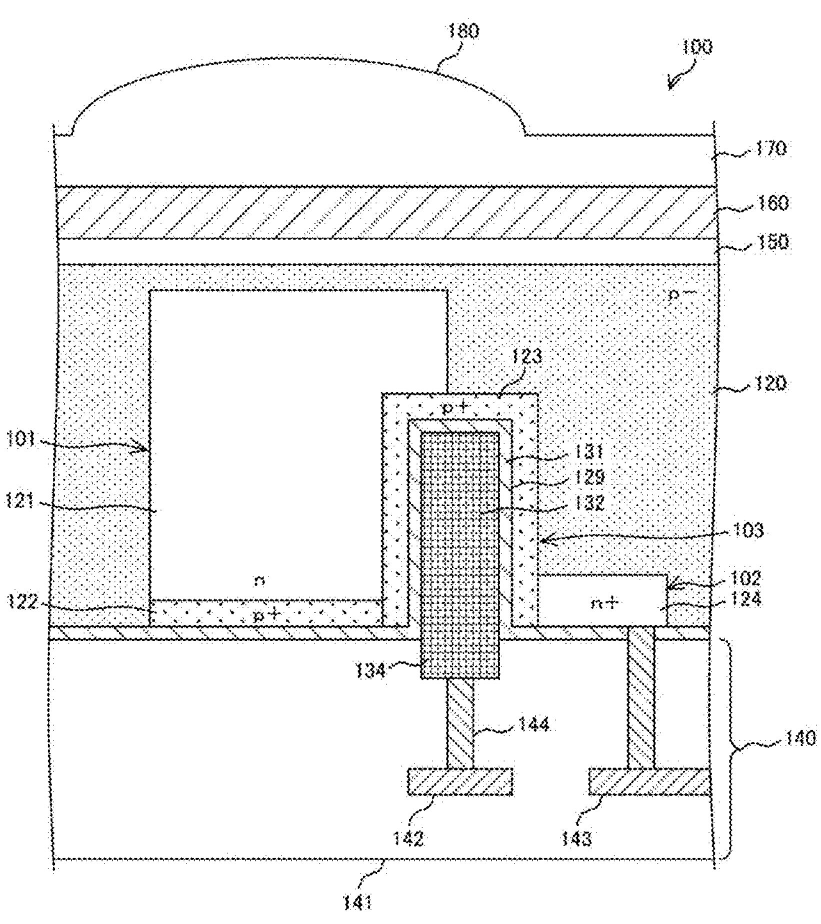
FIG. 11 is a cross-sectional view illustrating a configuration example of a pixel according to a second embodiment of the present disclosure.

FIG. 11 is a cross-sectional view illustrating a configuration example of a pixel according to the second embodiment of the present disclosure. The drawing is a schematic cross-sectional view illustrating a configuration example of a pixel 100, similarly to FIG. 3. This pixel differs from the pixel 100 described in FIG. 3 in that the substrate surface gate 133 of the charge transfer unit 103 is omitted.

The charge transfer unit 103 in the drawing controls the transfer of charge from a photoelectric conversion unit 101 to a charge holding unit 102 by an embedded gate 132. Also in the drawing, an opening portion 129 and the embedded gate 132 are configured in a polygonal shape in a plan view.

A configuration of the imaging element 1 other than the above-described configuration is the same as the configuration of the imaging element 1 described in the first embodiment of the present disclosure, and thus description thereof will be omitted.

As described above, in the imaging element 1 of the second embodiment of the present disclosure, a charge transfer path can be reduced also in a case where the substrate surface gate 133 of the charge transfer unit 103 is omitted.

3. Third Embodiment

In the above-described imaging element 1 of the first embodiment, the photoelectric conversion unit 101 of the pixel 100 is disposed in the vicinity of the front surface side of the semiconductor substrate 120. On the other hand, an imaging element 1 of a third embodiment of the present disclosure differs from that in the above-described first embodiment in that a photoelectric conversion unit 101 is disposed in a deep portion of the semiconductor substrate 120.

[Configuration of Pixel]

Figure 12:
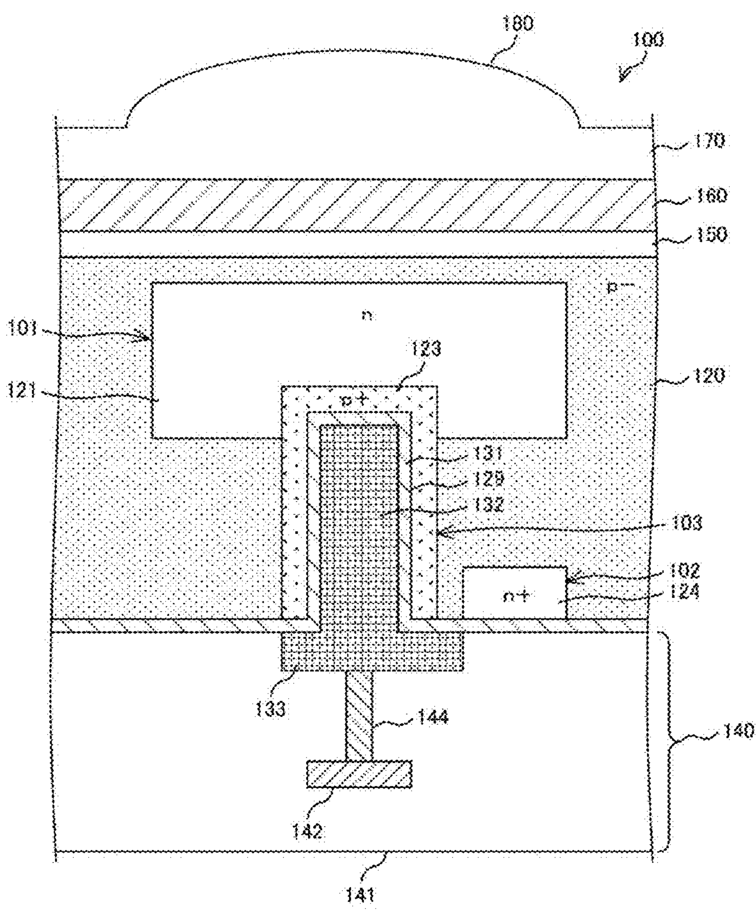
FIG. 12 is a cross-sectional view illustrating a configuration example of a pixel according to a third embodiment of the present disclosure.

FIG. 12 is a cross-sectional view illustrating a configuration example of a pixel according to the third embodiment of the present disclosure. The drawing is a schematic cross-sectional view illustrating a configuration example of the pixel 100, similarly to FIG. 3. The pixel 100 differs from the pixel 100 described in FIG. 3 in that a semiconductor region 121 of the photoelectric conversion unit 101 is disposed on the rear surface side of the semiconductor substrate 120.

The semiconductor region 121 of the photoelectric conversion unit 101 in the drawing is not disposed on the front surface side of the semiconductor substrate 120. For this reason, a semiconductor region 124 of a charge holding unit 102 disposed on the front surface side of the semiconductor substrate 120 can be disposed at a position overlapping the semiconductor region 121 of the photoelectric conversion unit 101. Thereby, it is possible to miniaturize the pixel 100.

A charge transfer unit 103 in the drawing transfers charge generated by the photoelectric conversion unit 101 in the thickness direction of the semiconductor substrate 120. An opening portion 129 and an embedded gate 132 of the charge transfer unit 103 are configured into a polygon in a plan view, similarly to the charge transfer unit 103 in FIG. 3. Thereby, it is possible to reduce the area of an inner surface of the opening portion 129 and reduce the surface level of the semiconductor substrate 120 in the opening portion 129. In addition, it is possible to suppress the generation of a dark current.

A configuration of the imaging element 1 other than the above-described configuration is the same as the configuration of the imaging element 1 described in the first embodiment of the present disclosure and thus description thereof will be omitted.

As described above, in the imaging element 1 of the third embodiment of the present disclosure, charge generated by the photoelectric conversion unit 101 disposed on the rear surface side of the semiconductor substrate 120 is transferred in the thickness direction of the semiconductor substrate 120 by the charge transfer unit 103. Even in such a case, the opening portion 129 and the embedded gate 132 of the charge transfer unit 103 are configured in a polygonal shape, and thus it is possible to reduce a surface level formed in the opening portion 129 and reduce the generation of a dark current.

Note that the opening portion 129 and the embedded gate 132 in FIG. 10 can be applied to other embodiments. Specifically, the opening portion 129 and the embedded gate 132 in FIG. 10 can be applied to the charge transfer unit 103 in FIGS. 11 and 12.

4. Example of Application to Camera

The technology according to the present disclosure (the present technology) can be applied to various products. For example, the present technology may be realized as an imaging element mounted on an imaging device such as a camera.

Figure 13:
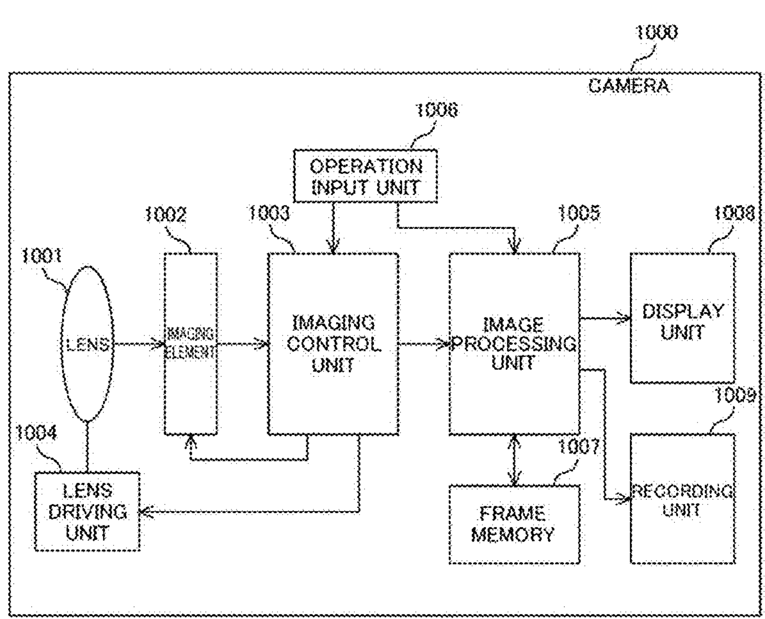
FIG. 13 is a block diagram illustrating a schematic configuration example of a camera which is an example of an imaging device to which the present technology can be applied.

FIG. 13 is a block diagram illustrating a schematic configuration example of a camera which is an example of an imaging device to which the present technology is applicable. A camera 1000 in the drawing includes a lens 1001, an imaging element 1002, an imaging control unit 1003, a lens driving unit 1004, an image processing unit 1005, an operation input unit 1006, a frame memory 1007, a display unit 1008, and a recording unit 1009.

The lens 1001 is an imaging lens of the camera 1000. The lens 1001 focuses light from a subject, causes the light to be incident on the imaging element 1002, which will be described later, and forms an image of the subject.

The imaging element 1002 is a semiconductor element that images the light from the subject focused by the lens 1001. The imaging element 1002 generates an analog image signal corresponding to emitted light, converts the analog image signal into a digital image signal, and outputs the digital image signal.

The imaging control unit 1003 controls imaging in the imaging element 1002. The imaging control unit 1003 controls the imaging element 1002 by generating a control signal and outputting the control signal to the imaging element 1002. In addition, the imaging control unit 1003 can perform auto-focus in the camera 1000 based on an image signal output from the imaging element 1002. Here, the auto-focus is a system that detects a focal position of the lens 1001 and automatically adjusts the focal position. As the auto-focus, a method of detecting an image surface phase difference according to phase difference pixels disposed in the imaging element 1002 to detect a focal position (image surface phase difference auto-focus) can be used. In addition, a method of detecting a position at which the contrast of an image is maximized as a focal position (contrast auto-focus) can also be applied. The imaging control unit 1003 adjusts the position of the lens 1001 through the lens driving unit 1004 based on the detected focal position and performs auto-focus. Meanwhile, the imaging control unit 1003 can be configured as, for example, a digital signal processor (DSP) provided with firmware.

The lens driving unit 1004 drives the lens 1001 based on the control of the imaging control unit 1003. The lens driving unit 1004 can drive the lens 1001 by changing the position of the lens 1001 using a built-in motor.

The image processing unit 1005 processes an image signal generated by the imaging element 1002. This processing corresponds to, for example, demosaicing for generating an image signal of an insufficient color among image signals corresponding to red, green, and blue for each pixel, noise reduction for removing noise in an image signal, image signal encoding, and the like. The image processing unit 1005 can be constituted by, for example, a microcomputer provided with firmware.

The operation input unit 1006 receives an operation input from a user of the camera 1000. For example, a push button or a touch panel can be used as the operation input unit 1006. An operation input received by the operation input unit 1006 is transmitted to the imaging control unit 1003 and the image processing unit 1005. Thereafter, processing corresponding to the operation input, for example, processing such as imaging of a subject is started.

A frame memory 1007 is memory that stores a frame which is an image signal corresponding to one screen. The frame memory 1007 is controlled by the image processing unit 1005 and holds frames during image processing.

The display unit 1008 displays an image processed by the image processing unit 1005. For example, a liquid crystal panel can be used as the display unit 1008.

The recording unit 1009 records an image processed by the image processing unit 1005. For example, a memory card or a hard disk can be used as the recording unit 1009.

A camera to which the present disclosure can be applied has been described above. The present technology can be applied to the imaging element 1002 among the components described above. Specifically, the imaging element 1 illustrated in FIG. 1 can be applied to the imaging element 1002. Since the transfer efficiency of charge in the charge transfer unit 103 is improved by applying the imaging element 1 to the imaging element 1002, it is possible to increase the speed of imaging of the camera 1000. Note that the image processing unit 1005 is an example of a processing circuit recited in the claims. The camera 1000 is an example of an imaging device described in the claims.

5. Example of Application to Endoscopic Operation System

The technology according to the present disclosure can be applied to various products. For example, the technology according to the present disclosure may be applied to an endoscopic operation system.

Figure 14:
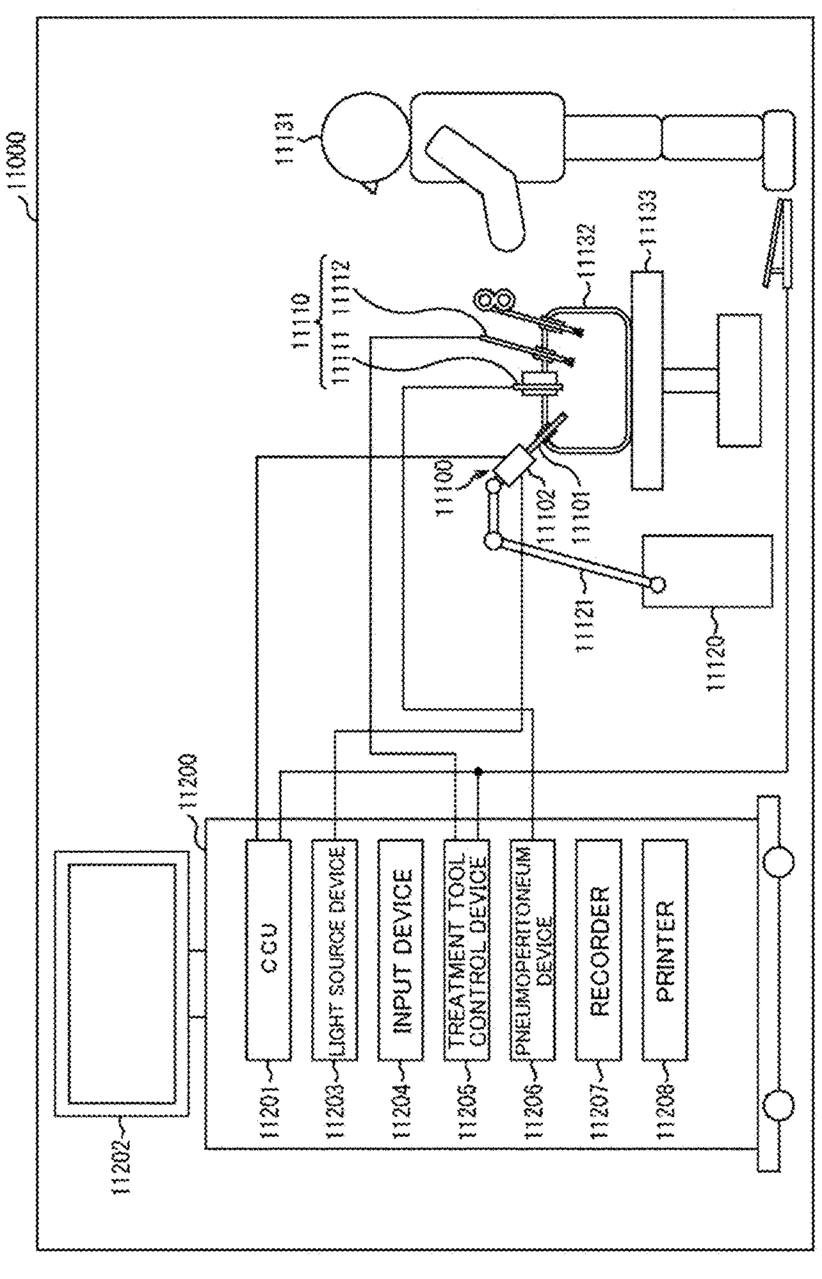
FIG. 14 is a diagram illustrating an example of a schematic configuration of an endoscopic operation system.

FIG. 14 is a diagram illustrating an example of a schematic configuration of an endoscopic operation system to which the technique according to the present disclosure is applicable.

FIG. 14 illustrates a state where an operator (doctor) 11131 is performing a surgical operation on a patient 11132 on a patient bed 11133 by using the endoscopic operation system 11000. As illustrated, the endoscopic operation system 11000 includes an endoscope 11100, other operation tools 11110 such as a pneumoperitoneum tube 11111 or an energy treatment tool 11112, a support arm device 11120 supporting the endoscope 11100, and a cart 11200 on which various devices for an endoscopic operation are mounted.

The endoscope 11100 includes a body tube 11101 of which a region with a predetermined length is inserted from a distal end into a body cavity of the patient 11132 and a camera head 11102 connected to a base end of the body tube 11101. In the illustrated example, the endoscope 11100 configured as a so-called hard mirror having a hard body tube 11101 is illustrated, but the endoscope 11100 may be configured as a so-called soft mirror having a soft body tube.

At the distal end of the body tube 11101, an opening portion into which an objective lens is inserted is provided. A light source device 11203 is connected to the endoscope 11100, light generated by the light source device 11203 is guided to the distal end of the body tube by a light guide extended to the inside of the body tube 11101, and the light is radiated to an observation target in the cavity of the patient 11132 through the objective lens. The endoscope 11100 may be a direct-viewing mirror, an oblique-viewing mirror, or a side-viewing mirror.

An optical system and an imaging element are provided inside the camera head 11102 and light (observation light) reflected from the observation target is focused on the imaging element by the optical system. The observation light is photoelectrically converted by the imaging element and an electric signal corresponding to the observation light, that is, an image signal corresponding to an observation image, is generated. The image signal is transmitted to a CCU (Camera Control Unit) 11201 as RAW data.

The CCU 11201 is configured of a central processing unit (CPU), a graphics processing unit (GPU) or the like, and comprehensively controls operations of the endoscope 11100 and a display device 11202. Further, the CCU 11201 receives the image signal from the camera head 11102 and performs various image processing such as development processing (demosaic processing) on the image signal for displaying an image based on the image signal.

The display device 11202 displays an image based on an image signal having been subjected to image processing by the CCU 11201 under the control of the CCU 11201.

The light source device 11203 includes a light source such as a light emitting diode (LED) and supplies the endoscope 11100 with irradiation light for imaging an operation part or the like.

The input device 11204 is an input interface for the endoscopic operation system 11000. A user can input various kinds of information or instructions to the endoscopic operation system 11000 through the input device 11204. For example, the user inputs an instruction or the like to change imaging conditions (a kind of irradiation light, a magnification, a focal distance, and the like) for the endoscope 11100.

A treatment tool control device 11205 controls driving of the energy treatment tool 11112 for tissue cautery or incision, blood vessel sealing, or the like. A pneumoperitoneum device 11206 sends a gas into the cavity via the pneumoperitoneum tube 11111 to inflate the cavity of the patient 11132 in order to guarantee a visual field for the endoscope 11100 and guarantee a working space of the operator. A recorder 11207 is a device capable of recording various kinds of information regarding surgery. A printer 11208 is a device capable of printing various kinds of information regarding operation in various forms of text, images, graphs, or the like.

The light source device 11203 that supplies the endoscope 11100 with irradiation light at the time of imaging of an operation part can be constituted by, for example, an LED, a laser light source, or a white light source configured in combination thereof. When the white light source is configured in combination of an RGB laser light source, an output intensity and an output timing of each color (each wavelength) can be controlled with high accuracy. Therefore, the light source device 11203 can adjust white balance of a captured image. Further, in this case, by irradiating an observation target with laser light from the RGB laser light source chronologically and controlling driving of the imaging element of the camera head 11102 in synchronization with the irradiation timing, it is also possible to capture images corresponding to RGB chronologically. According to this method, it is possible to obtain a color image even when color filters are not provided in the imaging element.

The driving of the light source device 11203 may be controlled such that the intensity of light to be output is changed at each predetermined time. By controlling the driving of the imaging element of the camera head 11102 in synchronization with a change timing of the intensity of the light, acquiring images chronologically, and combining the images, it is possible to generate an image with a high dynamic range in which there are no so-called black spots and white spots.

The light source device 11203 may be configured to be able to supply light with a predetermined wavelength band corresponding to special light observation. In the special light observation, for example, so-called narrow band imaging in which a predetermined tissue such as a blood vessel of a mucosal surface layer is imaged with high contrast through irradiation with light in a narrower band than irradiation light (that is, white light) at the time of normal observation using a dependence of absorption of light in a body tissue on a wavelength is performed. Alternatively, in the special light observation, fluorescence observation in which an image is obtained using fluorescence generated through excitation light irradiation may be performed. The fluorescence observation can be performed by emitting excitation light to a body tissue and observing fluorescence from the body tissue (autofluorescence observation), or locally injecting a reagent such as indocyanine green (ICG) to a body tissue and emitting excitation light corresponding to a fluorescence wavelength of the reagent to the body tissue to obtain a fluorescence image. The light source device 11203 may be configured to be able to supply narrow band light and/or excitation light corresponding to such special light observation.

Figure 15:
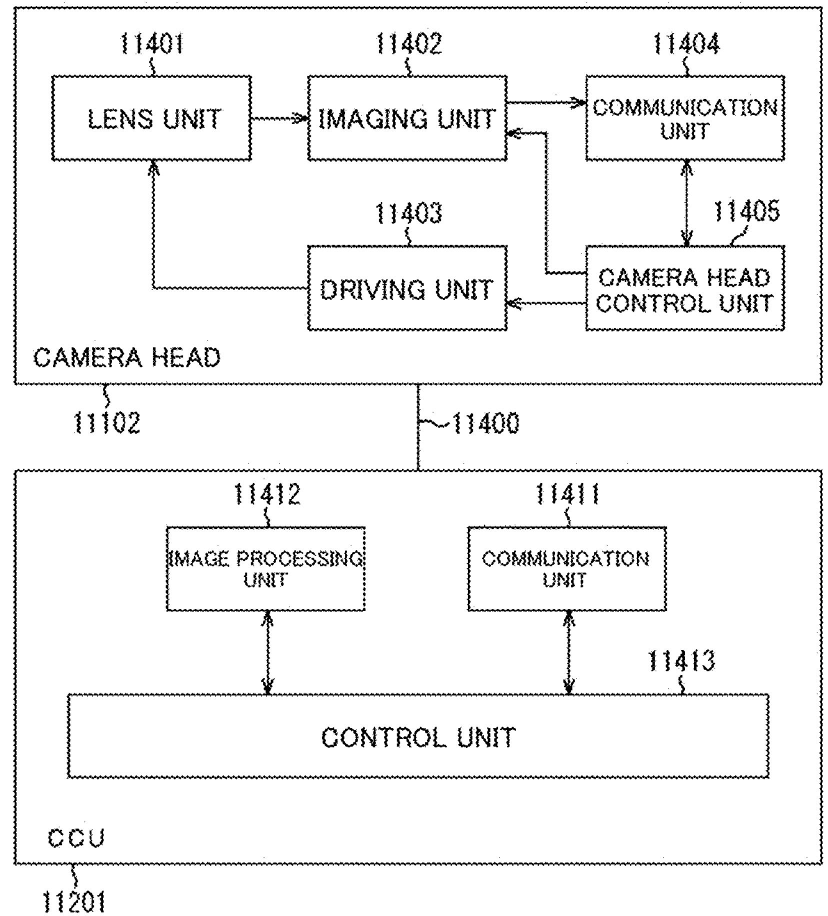
FIG. 15 is a block diagram illustrating an example of a functional configuration of a camera head and a CCU.

FIG. 15 is a block diagram illustrating an example of functional configurations of the camera head 11102 and the CCU 11201 illustrated in FIG. 14.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a control unit 11413. The camera head 11102 and the CCU 11201 are connected to be able to communicate with each other via a transmission cable 11400.

The lens unit 11401 is an optical system provided in a connection unit with the body tube 11101. Observation light received from the distal end of the body tube 11101 is guided to the camera head 11102 and is incident on the lens unit 11401. The lens unit 11401 is configured to a plurality of lenses including a zoom lens and a focus lens in combination.

The imaging unit 11402 is constituted by an imaging element. The imaging element constituting the imaging unit 11402 may be one element (so-called single plate type) or a plurality of elements (so-called multi-plate type). When the imaging unit 11402 is configured as a multi-plate type, for example, image signals corresponding to RGB are generated by the imaging elements, and a color image may be obtained by synthesizing the image signals. Alternatively, the imaging unit 11402 may be configured to include a pair of imaging elements for respectively acquiring right-eye image signals and left-eye image signals corresponding to 3D (dimensional) display. By performing the 3D display, the operator 11131 can ascertain the depth of a body tissue in an operation part more accurately. When the imaging unit 11402 is configured as a multiple-plate, a plurality of systems of the lens unit 11401 may be provided to correspond to each imaging element.

In addition, the imaging unit 11402 may not necessarily be provided in the camera head 11102. For example, the imaging unit 11402 may be provided immediately after the objective lens inside the body tube 11101.

The driving unit 11403 is constituted by an actuator and the zoom lens and the focus lens of the lens unit 11401 are moved by a predetermined distance along an optical axis under the control of the camera head control unit 11405. Thereby, it is possible to appropriately adjust the magnification and focus of a captured image by the imaging unit 11402.

The communication unit 11404 is constituted by a communication device for transmitting or receiving various information to or from the CCU 11201. The communication unit 11404 transmits an image signal obtained from the imaging unit 11402 to the CCU 11201 as raw data via the transmission cable 11400.

In addition, the communication unit 11404 receives a control signal for controlling driving of the camera head 11102 from the CCU 11201 and supplies the control signal to the camera head control unit 11405. The control signal includes, for example, information regarding imaging conditions such as information indicating designation of a frame rate of a captured image, information indicating designation of an exposure value at the time of imaging, and/or information indicating designation of the magnification and focus of the captured image.

Note that imaging conditions such as the foregoing frame rate, exposure value, magnification, and focus may be designated appropriately by the user or may be set automatically by the control unit 11413 of the CCU 11201 based on the acquired image signal. In the latter case, a so-called auto exposure (AE) function, an auto focus (AF) function, and an auto white balance (AWB) function are provided to the endoscope 11100.

The camera head control unit 11405 controls the driving of the camera head 11102 based on the control signal from the CCU 11201 received via the communication unit 11404.

The communication unit 11411 is constituted by a communication device for transmitting or receiving various information to or from the camera head 11102. The communication unit 11411 receives an image signal transmitted via the transmission cable 11400 from the camera head 11102.

In addition, the communication unit 11411 transmits a control signal for controlling the driving of the camera head 11102 to the camera head 11102. The image signal or the control signal can be transmitted through electric communication, optical communication, or the like.

The image processing unit 11412 applies various kinds of image processing to the image signal which is the raw data transmitted from the camera head 11102.

The control unit 11413 performs various kinds of control on imaging of an operation part or the like by the endoscope 11100 and display of a captured image obtained through imaging of an operation part or the like. For example, the control unit 11413 generates a control signal for controlling driving of the camera head 11102.

In addition, the control unit 11413 causes the display device 11202 to display the captured image in which the operation part or the like is shown, based on the image signal subjected to the image processing in the image processing unit 11412. At this time, the control unit 11413 may recognize various objects in the captured image using various image recognition technologies. For example, the control unit 11413 can recognize an operation tool such as forceps, a specific biological part, bleeding, or mist or the like at the time of use of the energy treatment tool 11112 by detecting the shape, color, or the like of the edge of an object included in the captured image. The control unit 11413 may superimpose various kinds of operation support information on the image of the operation part for display using the recognition result when the display device 11202 is caused to display the captured image. By superimposing and displaying the operation support information and presenting the operation support information to the operator 11131, it is possible to reduce a burden on the operator 11131 or allow the operator 11131 to perform an operation reliably.

The transmission cable 11400 connecting the camera head 11102 and the CCU 11201 to each other is an electric signal cable that supports electric signal communication, an optical fiber that supports optical communication, or a composite cable thereof.

Here, in the example illustrated in the drawing, communication is performed in a wired manner using the transmission cable 11400, but communication between the camera head 11102 and the CCU 11201 may be performed in a wireless manner.

An example of the endoscopic operation system to which the technique according to the present disclosure can be applied has been described above. The technology according to the present disclosure may be applied to the imaging unit 11402 of the camera head 11102 among the configurations described above. Specifically, the imaging element 1 in FIG. 1 can be applied to the imaging unit 10402. High-speed imaging can be performed by applying the technology according to the present disclosure to the imaging unit 10402.

Here, although the endoscopic operation system has been described as an example, the technology according to the present disclosure may be applied to other, for example, a microscopic operation system.

6. Example of Application to Moving Body

The technology according to the present disclosure can be applied to various products. For example, the technology of the present disclosure may be implemented as a device mounted in any type of moving body such as an automobile, an electric automobile, a hybrid electric automobile, a motorbike, a bicycle, a personal mobility, an airplane, a drone, a ship, and a robot.

Figure 16:
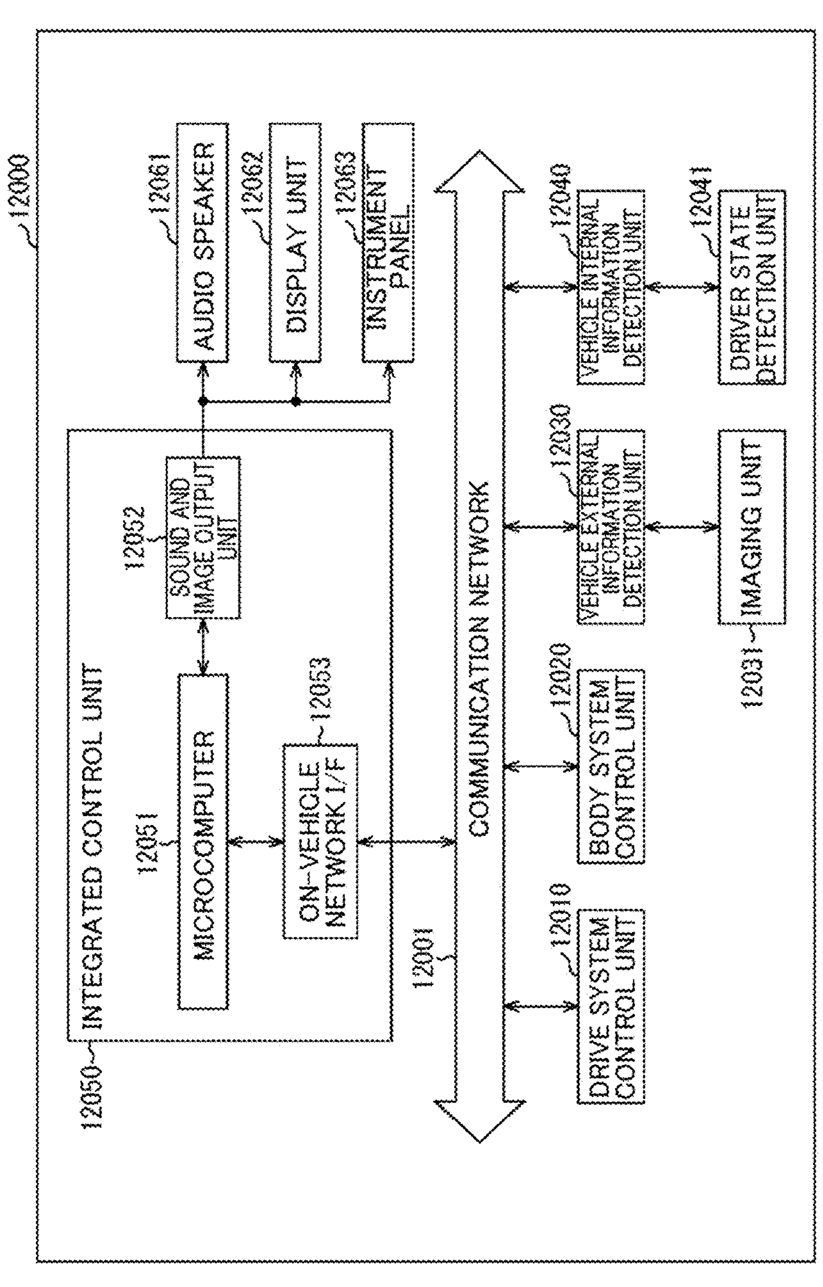
FIG. 16 is a block diagram illustrating an example of a schematic configuration of a vehicle control system.

FIG. 16 is a block diagram illustrating a schematic configuration example of a vehicle control system, which is an example of a moving body control system to which the technique according to the present disclosure can be applied.

A vehicle control system 12000 includes a plurality of electronic control units connected to each other via a communication network 12001. In the example illustrated in FIG. 16, the vehicle control system 12000 includes a drive system control unit 12010, a body system control unit 12020, a vehicle external information detection unit 12030, a vehicle internal information detection unit 12040, and an integrated control unit 12050. Further, as functional constituents of the integrated control unit 12050, a microcomputer 12051, a sound and image output unit 12052, and an on-vehicle network I/F (Interface) 12053 are illustrated.

The drive system control unit 12010 controls an operation of a device related to a drive system of a vehicle according to various programs. For example, the drive system control unit 12010 functions as a control device of a driving force generator for generating a driving force of a vehicle such as an internal combustion engine or a driving motor, a driving force transmission mechanism for transmitting a driving force to wheels, a steering mechanism for adjusting a turning angle of a vehicle, a braking device that generates a braking force of a vehicle and the like.

The body system control unit 12020 controls operations of various devices equipped in a vehicle body in accordance with various programs. For example, the body system control unit 12020 functions as a control device of a keyless entry system, a smart key system, a power window device, or various lamps such as a head lamp, a back lamp, a brake lamp, a turn signal, or a fog lamp. In this case, radio waves transmitted from a portable device that substitutes for a key or signals of various switches can be input to the body system control unit 12020. The body system control unit 12020 receives inputs of these radio waves or signals and controls a door lock device, a power window device, a lamp, and the like of the vehicle.

The vehicle external information detection unit 12030 detects information on the outside of the vehicle having the vehicle control system 12000 mounted thereon. For example, an imaging unit 12031 is connected to the vehicle external information detection unit 12030. The vehicle external information detection unit 12030 causes the imaging unit 12031 to capture an image outside the vehicle and receives the captured image. The vehicle external information detection unit 12030 may perform object detection processing or distance detection processing for people, cars, obstacles, signs, and letters on a road based on the received image.

The imaging unit 12031 is an optical sensor that receives light and outputs an electrical signal according to the amount of received light. The imaging unit 12031 can also output the electrical signal as an image and ranging information. In addition, light received by the imaging unit 12031 may be visible light, or may be invisible light such as infrared light.

The vehicle internal information detection unit 12040 detects information inside the vehicle. For example, a driver state detection unit 12041 that detects a state of a driver is connected to the vehicle internal information detection unit 12040. The driver state detection unit 12041 includes, for example, a camera that captures an image of the driver, and the vehicle internal information detection unit 12040 may calculate a degree of fatigue or concentration of the driver or may determine whether or not the driver is dozing based on detection information input from the driver state detection unit 12041.

The microcomputer 12051 can calculate a control target value of the driving force generation device, the steering mechanism, or the braking device based on information inside and outside the vehicle acquired by the vehicle external information detection unit 12030 or the vehicle internal information detection unit 12040, and output a control command to the drive system control unit 12010. For example, the microcomputer 12051 can perform cooperative control for the purpose of realization of functions of an advanced driver assistance system (ADAS) including collision avoidance or impact mitigation of a vehicle, follow-up traveling based on an inter-vehicle distance, vehicle speed keeping traveling, a vehicle collision warning, a vehicle lane departure warning, and the like.

Further, the microcomputer 12051 can perform cooperative control for the purpose of automated driving or the like in which automated travel is performed without depending on operations of the driver by controlling the driving force generator, the steering mechanism, the braking device, and the like based on information regarding the surroundings of the vehicle acquired by the vehicle external information detection unit 12030 or the vehicle internal information detection unit 12040.

In addition, the microcomputer 12051 can output a control command to the body system control unit 12020 based on the information outside the vehicle acquired by the vehicle external information detection unit 12030. For example, the microcomputer 12051 can perform cooperative control for the purpose of preventing glare, such as switching from a high beam to a low beam, by controlling the headlamp according to the position of a preceding vehicle or an oncoming vehicle detected by the vehicle external information detection unit 12030.

The sound and image output unit 12052 transmits an output signal of at least one of audio and an image to an output device capable of visually or audibly notifying a passenger or the outside of the vehicle of information. In the example of FIG. 16, an audio speaker 12061, a display unit 12062, and an instrument panel 12063 are illustrated as the output device. The display unit 12062 may include, for example, at least one of an on-board display and a heads-up display.

Figure 17:
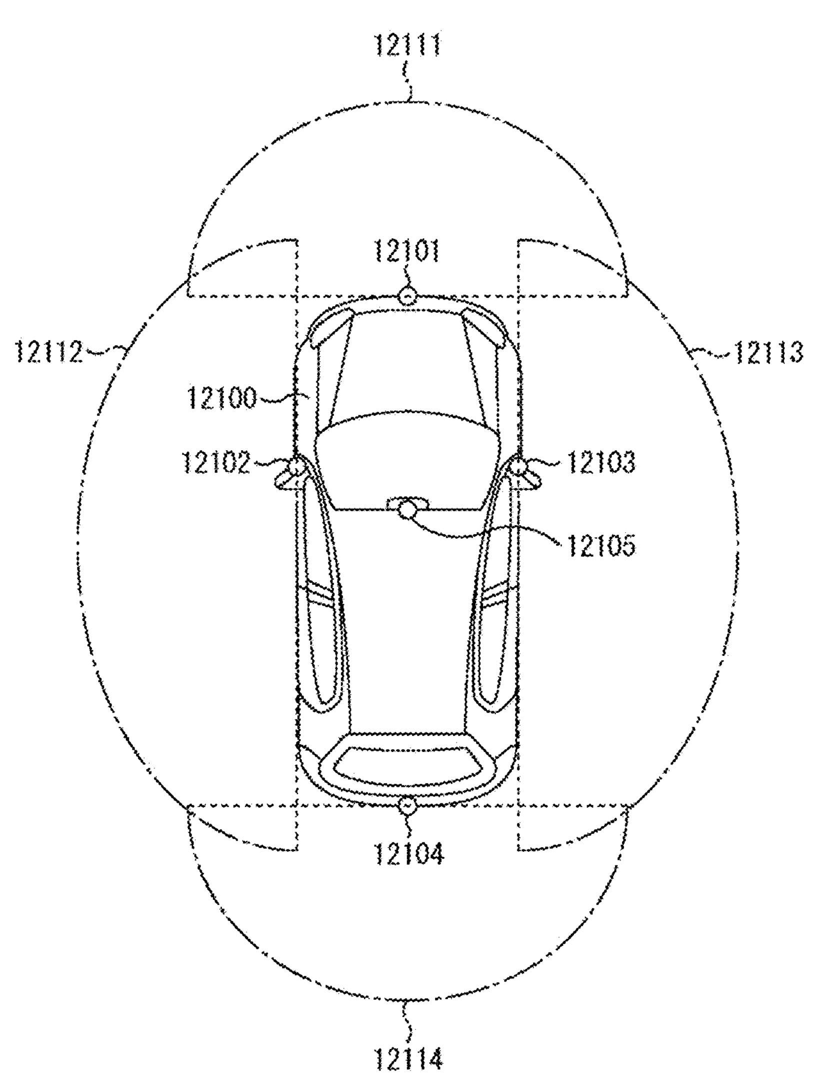
FIG. 17 is a diagram illustrating an example of installation positions of a vehicle external information detection unit and an imaging unit.

FIG. 17 is a diagram illustrating an example of an installation position of the imaging unit 12031.

In FIG. 17, a vehicle 12100 includes imaging units 12101, 12102, 12103, 12104, and 12105 as the imaging unit 12031.

The imaging units 12101, 12102, 12103, 12104, and 12105 are provided at, for example, positions of a front nose, side mirrors, a rear bumper, a back door, an upper portion of a vehicle internal front windshield, and the like of the vehicle 12100. The imaging unit 12101 provided on a front nose and the imaging unit 12105 provided in an upper portion of the vehicle internal front windshield mainly acquire images in front of the vehicle 12100. The imaging units 12102 and 12103 provided on the side mirrors mainly acquire images on the lateral side of the vehicle 12100. The imaging unit 12104 provided on the rear bumper or the back door mainly acquires images in the rear of the vehicle 12100. The front view images acquired by the imaging units 12101 and 12105 are mainly used for detection of preceding vehicles, pedestrians, obstacles, traffic signals, traffic signs, lanes, and the like.

Note that FIG. 17 illustrates an example of imaging ranges of the imaging units 12101 to 12104. An imaging range 12111 indicates an imaging range of the imaging unit 12101 provided in the front nose, imaging ranges 12112 and 12113 indicate imaging ranges of the imaging units 12102 and 12103 provided in the side mirror, respectively, and an imaging range 12114 indicates an imaging range of the imaging unit 12104 provided in the rear bumper or back door. For example, a bird's-eye view image of the vehicle 12100 from above can be obtained by superimposing image data captured by the imaging units 12101 to 12104.

At least one of the imaging units 12101 to 12104 may have a function for acquiring distance information. For example, at least one of the imaging units 12101 to 12104 may be a stereo camera constituted by a plurality of imaging elements or may be an imaging element having pixels for phase difference detection.

For example, the microcomputer 12051 can extract, particularly, a closest three-dimensional object on a path through which the vehicle 12100 is traveling, which is a three-dimensional object traveling at a predetermined speed (for example, 0 km/h or higher) in the substantially same direction as the vehicle 12100, as a preceding vehicle by acquiring a distance to each of three-dimensional objects in the imaging ranges 12111 to 12114 and temporal change in the distance (a relative speed with respect to the vehicle 12100) based on distance information obtained from the imaging units 12101 to 12104. Further, the microcomputer 12051 can set an inter-vehicle distance which should be guaranteed in advance in front of a preceding vehicle and can perform automated brake control (also including following stop control) or automated acceleration control (also including following start control). Thus, it is possible to perform cooperative control for the purpose of, for example, automated driving in which the vehicle autonomously travels without requiring the driver to perform operations.

For example, the microcomputer 12051 can classify and extract three-dimensional data regarding three-dimensional objects into other three-dimensional objects such as a two-wheeled vehicle, a normal vehicle, a large vehicle, a pedestrian, and an electric pole based on distance information obtained from the imaging units 12101 to 12104 and can use the other three-dimensional objects to perform automated avoidance of obstacles. For example, the microcomputer 12051 identifies surrounding obstacles of the vehicle 12100 as obstacles which can be viewed by the driver of the vehicle 12100 and obstacles which are difficult to view. Then, the microcomputer 12051 determines a collision risk indicating the degree of risk of collision with each obstacle, and when the collision risk is equal to or higher than the set value and there is a possibility of collision, an alarm is output to the driver through the audio speaker 12061 and the display unit 12062, forced deceleration and avoidance steering are performed through the drive system control unit 12010, and thus it is possible to perform driving support for collision avoidance.

At least one of the imaging units 12101 to 12104 may be an infrared camera that detects infrared rays. For example, the microcomputer 12051 can recognize a pedestrian by determining whether there is a pedestrian in the captured image of the imaging units 12101 to 12104. Such recognition of a pedestrian is performed through, for example, a procedure of extracting feature points in the captured images of the imaging units 12101 to 12104 serving as infrared cameras, and a procedure of performing pattern matching processing on a series of feature points indicating a contour of an object to determine whether or not the object is a pedestrian. When the microcomputer 12051 determines that pedestrians are in the images captured by the imaging units 12101 to 12104 and recognize the pedestrians, the sound and image output unit 12052 controls the display unit 12062 such that rectangular contour lines for emphasis are superimposed and displayed on the recognized pedestrians. In addition, the sound and image output unit 12052 may control the display unit 12062 such that icons and the like indicating pedestrians are displayed at desired positions.

The example of the vehicle control system to which the technology according to the present disclosure can be applied has been described above. The technique according to the present disclosure may be applied to the imaging unit 12031 and the like among the above-described configurations. Specifically, the imaging element 1 described in FIG. 1 can be applied to the imaging unit 12031 and the like. High-speed imaging can be performed by applying the technology according to the present disclosure to the imaging unit 12031 and the like.

Finally, the descriptions of the above-described embodiments are merely examples of the present disclosure, and the present disclosure is not limited to the above-described embodiments. Therefore, it goes without saying that various changes aside from the above-described embodiments can be made according to the design and the like within a scope that does not depart from the technical spirit of the present disclosure.

Additionally, the effects described in the present specification are merely examples, and are not limiting. Other effects may be obtained as well.

In addition, the drawings in the above-described embodiments are schematic, and dimensional ratios and the like of respective parts are not necessarily consistent with actual ones. In addition, the drawings of course include parts where dimensional relationships and ratios differ from drawing to drawing.

Note that the present technique can also have the following configurations.

(1) An imaging element including:

a photoelectric conversion unit configured to be disposed on a semiconductor substrate and to generate charge corresponding to incident light by photoelectric conversion;

a charge holding unit configured to hold the charge;

a charge transfer unit configured to include an opening portion, which is formed in the semiconductor substrate and having a polygonal shape in a plan view, and an embedded gate disposed in the opening portion and to transfer the charge from the photoelectric conversion unit to the charge holding unit; and an image signal generation unit configured to generate an image signal based on the held charge.

(2) The imaging element according to (1), wherein the charge transfer unit includes the opening portion having a polygonal shape with six or more sides.

(3) The imaging element according to (2), wherein the charge transfer unit includes the opening portion having a polygonal shape in which an interior angle of a vertex is 120 to 150 degrees.

(4) The imaging element according to (3), wherein the charge transfer unit includes the opening portion having an octagonal shape.

(5) The imaging element according to any one of (1) to (4), wherein the charge transfer unit includes the opening portion having a polygonal shape which is formed by performing recrystallization of a member constituting the semiconductor substrate.

(6) The imaging element according to any one of (1) to (5), wherein the photoelectric conversion unit includes a boundary surface parallel to a side of the polygon of the opening portion of the charge transfer unit.

(7) The imaging element according to any one of (1) to (6), wherein the charge holding unit includes a boundary surface parallel to a side of the polygon of the opening portion of the charge transfer unit.

(8) The imaging element according to any one of (1) to (7), wherein the charge transfer unit further includes a gate insulating film disposed between the semiconductor substrate and the embedded gate.

(9) The imaging element according to (8), wherein the charge transfer unit includes the gate insulating film formed by oxidizing the semiconductor substrate.

(10) The imaging element according to (9), wherein the charge transfer unit includes the gate insulating film formed by oxidizing the semiconductor substrate with oxygen radicals.

(11) The imaging element according to any one of (1) to (10), wherein the semiconductor substrate is formed of silicon.

(12) The imaging element according to any one of (1) to (11), wherein the charge transfer unit further includes a high impurity concentration region which is disposed on the semiconductor substrate adjacent to the opening portion and configured to have a high impurity concentration.

(13) The imaging element according to (12), wherein the charge transfer unit further includes a substrate surface gate which is adjacent to the embedded gate and configured to have a shape covering the high impurity concentration region on a front surface side of the semiconductor substrate.

(14) The imaging element according to any one of (1) to (13), further including a second high impurity concentration region which is adjacent to the photoelectric conversion unit, disposed on a front surface side of the semiconductor substrate, and configured to have a high impurity concentration.

(15) An imaging device including:

a photoelectric conversion unit configured to be disposed on a semiconductor substrate and to generate charge corresponding to incident light by photoelectric conversion;

a charge holding unit configured to hold the charge;

a charge transfer unit configured to include an opening portion, which is formed in the semiconductor substrate and having a polygonal shape in a plan view, and an embedded gate disposed in the opening portion and to transfer the charge from the photoelectric conversion unit to the charge holding unit;

an image signal generation unit configured to generate an image signal based on the held charge; and a processing circuit configured to process the generated image signal.

REFERENCE SIGNS LIST

1, 1002 Imaging element
10 Pixel array portion
30 Column signal processing unit
100 Pixel
101 Photoelectric conversion unit
102 Charge holding unit
103 Charge transfer unit
104 to 106 MOS transistor
110 Image signal generation unit
120 Semiconductor substrate
129 Opening portion
131 Gate insulating film
132 Embedded gate
133 Substrate surface gate
403 Sacrificial oxide film
1000 Camera
1005 Image processing unit
10402, 12031, 12101 to 12105 Imaging unit

What is claimed is:

1. An imaging element, comprising:

a photoelectric conversion unit disposed in a semiconductor substrate, wherein a first surface of the photoelectric conversion unit is adjacent a first surface of the semiconductor substrate, and wherein a second surface of the photoelectric conversion unit is adjacent a second surface of the semiconductor substrate;

a charge holding unit disposed in the semiconductor substrate;

a charge transfer unit, wherein an opening portion of the charge transfer unit is formed in the first surface of the semiconductor substrate, wherein the opening portion of the charge transfer unit has a first polygonal shape in a plan view, wherein an embedded gate is disposed in the opening portion and extends from a first point adjacent to the first surface of the semiconductor substrate to a second point between the first surface of the semiconductor substrate and the second surface of the semiconductor substrate, wherein the second point is between the first surface of the photoelectric conversion unit and the second surface of the photoelectric conversion unit, wherein the embedded gate extends through an area that intersects an area of the photoelectric conversion unit in the plan view, wherein a portion of the photoelectric conversion unit is disposed between a portion of the embedded gate and the second surface of the semiconductor substrate, wherein the embedded gate has the first polygonal shape; and an image signal generation unit configured to generate an image signal based on charge transferred from the charge holding unit to the image signal generation unit, wherein the opening portion having the first polygonal shape is formed by performing recrystallization of a member constituting the semiconductor substrate, so that crystal orientation planes are formed at sides of the first polygonal shape.

2. The imaging element according to claim 1, wherein the charge transfer unit includes the opening portion having a polygonal shape with six or more sides.

3. The imaging element according to claim 1, wherein the charge transfer unit includes the opening portion having a polygonal shape in which an interior angle of a vertex is 120 to 150 degrees.

4. The imaging element according to claim 3, wherein the charge transfer unit includes the opening portion having an octagonal shape.

5. The imaging element according to claim 1, wherein the photoelectric conversion unit includes a boundary surface parallel to a side of the polygon of the opening portion of the charge transfer unit.

6. The imaging element according to claim 1, wherein the charge holding unit includes a boundary surface parallel to a side of the polygon of the opening portion of the charge transfer unit.

7. The imaging element according to claim 1, wherein the charge transfer unit further includes a gate insulating film disposed between the semiconductor substrate and the embedded gate.

8. The imaging element according to claim 7, wherein the charge transfer unit includes the gate insulating film formed by oxidizing the semiconductor substrate.

9. The imaging element according to claim 8, wherein the charge transfer unit includes the gate insulating film formed by oxidizing the semiconductor substrate with oxygen radicals.

10. The imaging element according to claim 1, wherein the semiconductor substrate is formed of silicon.

11. The imaging element according to claim 1, wherein the charge transfer unit further includes an impurity concentration region disposed on the semiconductor substrate adjacent to the opening portion.

12. The imaging element according to claim 11, wherein the charge transfer unit further includes a substrate surface gate which is adjacent to the embedded gate and configured to have a shape covering the impurity concentration region on a front surface side of the semiconductor substrate.

13. The imaging element according to claim 11, further comprising a second impurity concentration region adjacent to the photoelectric conversion unit and disposed on a front surface side of the semiconductor substrate.

14. The imaging element according to claim 1, wherein the charge holding unit has the first polygonal shape in the plan view.

15. The imaging element according to claim 14, wherein the first polygonal shape has at least six sides.

16. The imaging element according to claim 1, wherein the embedded gate extends through an area that intersects a corner of the photoelectric conversion unit in the plan view.

17. The imaging element according to claim 1, wherein an end of the embedded gate opposite the opening portion is disposed at the second point, wherein a portion of the photoelectric conversion unit is disposed between a portion of the end of the embedded gate opposite the opening portion and the second surface of the semiconductor substrate.

18. An imaging device, comprising:

a photoelectric conversion unit disposed in a semiconductor substrate, wherein a first surface of the photoelectric conversion unit is adjacent a first surface of the semiconductor substrate, and wherein a second surface of the photoelectric conversion unit is adjacent a second surface of the semiconductor substrate;

a charge holding unit disposed in the semiconductor substrate;

a charge transfer unit, wherein an opening portion of the charge transfer unit is formed in the first surface of the semiconductor substrate, wherein the opening portion of the charge transfer unit has a first polygonal shape in a plan view, wherein an embedded gate is disposed in the opening portion and extends from a first point adjacent to the first surface of the semiconductor substrate to a second point between the first surface of the semiconductor substrate and the second surface of the semiconductor substrate, wherein the second point is between the first surface of the photoelectric conversion unit and the second surface of the photoelectric conversion unit, wherein the embedded gate extends through an area that intersects an area of the photoelectric conversion unit in the plan view, wherein a portion of the photoelectric conversion unit is disposed between a portion of the embedded gate and the second surface of the semiconductor substrate, and wherein the embedded gate has the first polygonal shape;

an image signal generation unit configured to generate an image signal based on charge transferred from the charge holding unit to the image signal generation unit; and a processing circuit configured to process the generated image signal, wherein the opening portion having the first polygonal shape is formed by performing recrystallization of a member constituting the semiconductor substrate, so that crystal orientation planes are formed at sides of the first polygonal shape.

* * * * *